(12) United States Patent
Miyanami

(10) Patent No.: US 9,799,768 B2
(45) Date of Patent: Oct. 24, 2017

(54) SEMICONDUCTOR DEVICE AND METHOD FOR MANUFACTURING SAME

(71) Applicant: Sony Corporation, Tokyo (JP)

(72) Inventor: Yuki Miyanami, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/080,654

(22) Filed: Mar. 25, 2016

(65) Prior Publication Data

US 2016/0211374 A1    Jul. 21, 2016

Related U.S. Application Data

(63) Continuation of application No. 12/389,819, filed on Feb. 20, 2009.

(30) Foreign Application Priority Data

Mar. 7, 2008  (JP) .................................. 2008-057746

(51) Int. Cl.

| | | |
|---|---|---|
| *H01L 29/76* | (2006.01) | |
| *H01L 29/78* | (2006.01) | |
| *H01L 21/3105* | (2006.01) | |
| *H01L 21/318* | (2006.01) | |
| *H01L 21/768* | (2006.01) | |
| *H01L 29/423* | (2006.01) | |
| *H01L 29/49* | (2006.01) | |
| *H01L 29/51* | (2006.01) | |
| *H01L 29/66* | (2006.01) | |

(52) U.S. Cl.
CPC ...... *H01L 29/7848* (2013.01); *H01L 21/3105* (2013.01); *H01L 21/3185* (2013.01); *H01L 21/76825* (2013.01); *H01L 21/76828* (2013.01); *H01L 21/76832* (2013.01); *H01L 29/4236* (2013.01); *H01L 29/66545* (2013.01); *H01L 29/7843* (2013.01); *H01L 29/7845* (2013.01); *H01L 29/495* (2013.01); *H01L 29/4916* (2013.01); *H01L 29/4966* (2013.01); *H01L 29/513* (2013.01); *H01L 29/517* (2013.01); *H01L 29/6653* (2013.01); *H01L 2924/0002* (2013.01)

(58) Field of Classification Search
None
See application file for complete search history.

(56) References Cited

U.S. PATENT DOCUMENTS

| | | |
|---|---|---|
| 2003/0181005 A1 | 9/2003 | Hachimine et al. |
| 2006/0105106 A1 | 5/2006 | Balseanu et al. |
| 2007/0077708 A1 | 4/2007 | Frohberg et al. |
| 2007/0096195 A1 | 5/2007 | Hoentschel et al. |

(Continued)

OTHER PUBLICATIONS

Mayuzumi, S., et al.; "Extreme High-Performance n- and p-MOSFETSs Boosted by Dual-Metal/High-k Gate Damascene Process Using Top-Cut Dual Stress Liners on (100) Substrates"; IEDM 2007; Special Issue -98th Workshop of Silicon Technology Division in the Japanese Society of Applied Physics—Jan. 24, 2008; 4 pages.

*Primary Examiner* — Marc Armand
*Assistant Examiner* — Sarah Salerno
(74) *Attorney, Agent, or Firm* — Dentons US LLP

(57) ABSTRACT

A semiconductor device includes: a sidewall insulating film; a gate electrode; source and drain regions; a first stress film; and a second stress film.

9 Claims, 20 Drawing Sheets

(56) References Cited

U.S. PATENT DOCUMENTS

| | | |
|---|---|---|
| 2007/0096220 A1 | 5/2007 | Kim et al. |
| 2007/0126036 A1 | 6/2007 | Ohta et al. |
| 2007/0202653 A1 | 8/2007 | Hoentschel et al. |
| 2008/0076225 A1 | 3/2008 | Kohli et al. |
| 2008/0087967 A1 | 4/2008 | Kim |
| 2008/0173908 A1 | 7/2008 | Junker et al. |
| 2008/0217665 A1 | 9/2008 | Chen et al. |
| 2008/0237662 A1 | 10/2008 | Liao et al. |
| 2008/0261408 A1* | 10/2008 | Waite .............. H01L 21/823807 438/758 |
| 2008/0277730 A1 | 11/2008 | Mehrotra et al. |
| 2009/0014804 A1* | 1/2009 | Shima ............... H01L 21/28052 257/368 |
| 2009/0108367 A1 | 4/2009 | Yokoyama |

* cited by examiner

F I G . 1
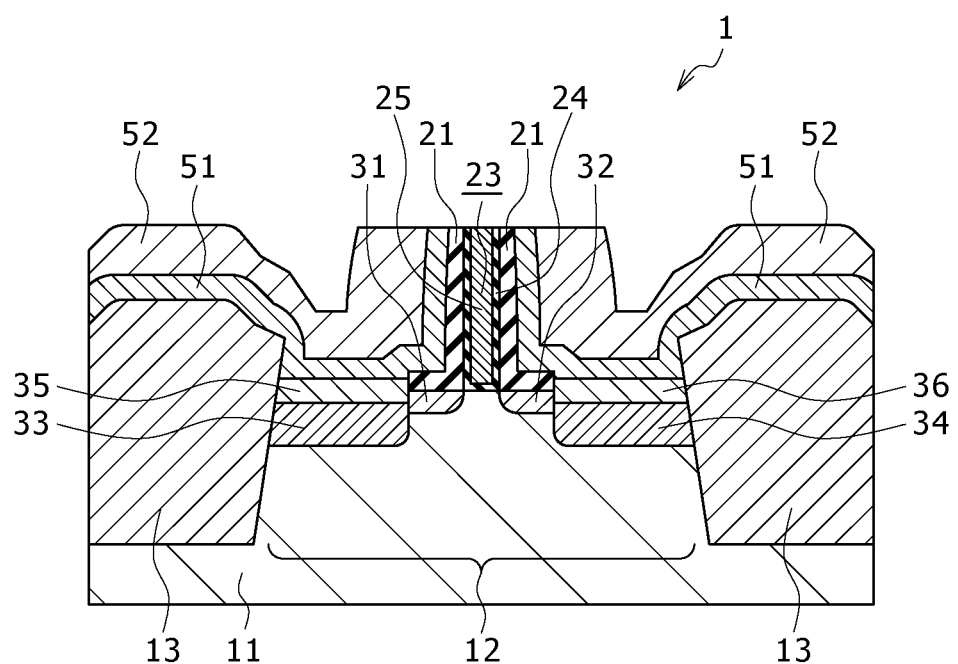

HEAT TREATMENT

UV CURING TREATMENT

UV CURING TREATMENT

UV CURING TREATMENT

HEAT TREATMENT

UV CURING TREATMENT

SEMICONDUCTOR DEVICE AND METHOD FOR MANUFACTURING SAME

CROSS REFERENCES TO RELATED APPLICATIONS

This application is a continuation of U.S. patent application Ser. No. 12/389,819 filed Feb. 20, 2009, the entirety of which is incorporated herein by reference to the extent permitted by law. The present invention contains subject matter related to Japanese Patent Application JP 2008-057746 filed in the Japan Patent Office on Mar. 7, 2008, the entire contents of which being incorporated herein by reference.

BACKGROUND OF THE INVENTION

1. Field of the Invention

The present invention relates to a semiconductor device and a method for manufacturing the same.

2. Description of Related Art

As a technique for enhancing the mobility of a transistor, combined use of a so-called damascene gate electrode structure and a stress liner film that applies stress to the channel region of the transistor is being studied. The damascene gate electrode structure is obtained by forming a metal gate electrode inside a trench formed by removing a dummy gate with the intermediary of a gate insulating film having a high dielectric constant. In general, the stress liner film is formed of a single-layer film.

For example, as shown in FIG. 7A, element isolation regions 113 by which an element formation region 112 is isolated are formed on a semiconductor substrate 111, and then a dummy gate pattern 142 is formed above the element formation region 112 of the semiconductor substrate 111 with the intermediary of a dummy gate insulating film 141. The dummy gate pattern 142 is formed of a poly-silicon film, and a silicon nitride film may be formed thereon. The dummy gate insulating film 141 is formed of a silicon oxide film.

Lightly doped regions 131 and 132 are formed in the semiconductor substrate 111 on both the sides of the dummy gate pattern 142. The lightly doped regions 131 and 132 are referred to also as extension regions. A sidewall insulating film 121 is formed on the sidewall of the dummy gate pattern 142 above the lightly doped regions 131 and 132. This sidewall insulating film 121 is generally formed of a silicon nitride film.

Furthermore, in the semiconductor substrate 111 on both the sides of the dummy gate pattern 142, heavily doped regions 133 and 134 that have impurity concentration higher than that of the lightly doped regions 131 and 132 and serve as source and drain are formed with the intermediary of the lightly doped regions 131 and 132.

Metal silicide layers 135 and 136 are formed on the heavily doped regions 133 and 134.

In addition, a stress applying film 151 for applying stress to the channel region of the transistor is formed over the semiconductor substrate 111 in such a manner as to cover the dummy gate pattern 142, the sidewall insulating film 121, and so on. In general, this stress applying film 151 is formed by using a silicon nitride film having tensile stress for an N-channel metal oxide semiconductor (NMOS) transistor, and is formed by using a silicon nitride film having compressive stress for a P-channel metal oxide semiconductor (PMOS) transistor.

In such a state, chemical mechanical polishing (CMP) is performed to expose upper part of the part composed of poly-silicon, of the dummy gate pattern 142. After the poly-silicon of the dummy gate pattern 142 is exposed, this dummy gate pattern 142 composed of the poly-silicon is removed by e.g. etching. Moreover, the dummy gate insulating film 141 is removed by wet etching with use of a dilute hydrofluoric acid.

As a result, as shown in FIG. 7B, a gate electrode formation trench 123 is formed in the area from which the dummy gate pattern 142 (see FIG. 7A) and the dummy gate insulating film 141 (see FIG. 7A) are removed. At the time of the etch removal of the dummy gate insulating film 141, part of the stress applying film 151, which is formed of a silicon nitride film, in contact with and in the vicinity of the sidewall insulating film 121 is etched. The causes thereof include low film quality of the stress applying film 151 at the initial stage of film deposition thereof in a related-art method for forming the stress liner film. Specifically, insufficiency in the wet-etching resistance of the stress liner film obtained at the initial stage of the film deposition thereof will be a cause.

Due to the film thickness loss of the stress liner film accompanying the etching thereof, the degree of the stress application to the channel region by the stress applying film 151 is lowered, which causes a problem that sufficient stress can not be applied to the channel region. FIG. 8 shows an electron micrograph image of a section of the stress applying film 151 whose partial portion close to the sidewall insulating film 121 is etched (refer to e.g. S. Mayuzumi, J. Wang, M. Yamakawa, Y. Tateshita, T. Hirano, M. Nakata, S. Yamaguchi, Y. Yamamoto, Y. Miyanami, I. Oshiyama, K. Tanaka, K. Tai, K. Ogawa, K. Kugimiya, Y. Nagahama, Y. Hagimoto, R. Yamamoto, S. Kanda, K. Nagano, H. Wakabayashi, Y. Tagawa, M. Tsukamoto, H. Iwamoto, M. Saito, S. Kadomura, and N. Nagashima, "Damascene gate process wo mochiita top-cut dual stress liner wo yuusuru kouseinou Metal/High-k Gate MOSFET (High-performance Metal/High-k Gate MOSFET formed by using damascene gate process and having top-cut dual stress liner, in English)" "IEDM2007" special issue, the report of the 98-th workshop of Silicon Technology Division in the Japanese Society of Applied Physics, p. 22 to 25, edited and issued by Silicon Technology Division in the Japanese Society of Applied Physics, Jan. 24, 2008).

SUMMARY OF THE INVENTION

The problem to be solved is that part obtained at the initial stage of film deposition, of a stress film (stress liner film) for applying stress to a channel region, is also etch-removed in removal of a dummy gate insulating film composed of silicon oxide and therefore stress can not be sufficiently applied to the channel region by the stress film.

There is a need for the present embodiment to form a stress film having etch resistance against etching of a silicon oxide film to thereby allow reduction in the film thickness loss of the stress film at the time of the etching.

According to an embodiment of the present invention, there is provided a semiconductor device including a sidewall insulating film configured to be provided on a semiconductor substrate and have a gate electrode formation trench formed therein, a gate electrode configured to be formed above the semiconductor substrate inside the gate electrode formation trench with the intermediary of a gate insulating film, and source and drain regions configured to be formed in the semiconductor substrate on both the sides of the gate electrode. The semiconductor device further includes a first stress film configured to be formed over the sidewall of the gate electrode with the intermediary of the sidewall insulating film over the semiconductor substrate and have stress, and a second stress film configured to be formed over the semiconductor substrate outside the first stress film and have the same type of stress as the type of the stress of the first stress film. The first stress film and the second stress film have etch resistance against an etching species used in etching of a silicon oxide film. The first stress film is superior to the second stress film in the etch resistance against the etching species.

In the semiconductor device according to this embodiment of the present invention, the first stress film and the second stress film having the same type of stress as that of this first stress film are formed over the sidewall of the gate electrode with the intermediary of the sidewall insulating film. This makes it possible to apply the stress of the first and second stress films to the channel region formed in the semiconductor substrate below the gate electrode.

For example, when the semiconductor device is a PMOS transistor, the mobility of the PMOS transistor can be enhanced if the stress of the first and second stress films is compressive stress.

When the semiconductor device is an NMOS transistor, the mobility of the NMOS transistor can be enhanced if the stress of the first and second stress films is tensile stress.

Furthermore, the first stress film and the second stress film have etch resistance against the etching species used in etching of a silicon oxide film, and the first stress film is superior to the second stress film in the etch resistance against the etching species. Therefore, even if etching of a silicon oxide film is performed in the formation of the gate electrode formation trench, the first and second stress films are poorly etched by the etching species of this etching. In addition, even if both the first and second stress films are etched, the degree of the etching of the first stress film is lower than that of the second stress film because the first stress film is superior to the second stress film in the etch resistance against the etching species.

Therefore, the first stress film is left close to the sidewall of the gate electrode. This makes it possible to surely apply the stress of the first stress film to the channel region formed in the semiconductor substrate below the gate electrode.

According to another embodiment of the present invention, there is provided a method for manufacturing a semiconductor device. The method includes the steps of forming a dummy gate pattern over a semiconductor substrate with the intermediary of a dummy gate insulating film, forming a sidewall insulating film on the sidewall of the dummy gate pattern, forming source and drain regions in the semiconductor substrate on both the sides of the dummy gate pattern, and forming a first stress film and a second stress film stacked on the first stress film over the semiconductor substrate. The first stress film and the second stress film cover the dummy gate pattern and the sidewall insulating film and apply stress to the semiconductor substrate under the dummy gate insulating film. The method further includes the steps of exposing upper part of the dummy gate pattern by removing the first stress film and the second stress film above the dummy gate pattern, forming a gate electrode formation trench by removing the dummy gate pattern and the dummy gate insulating film, and forming a gate electrode above the semiconductor substrate inside the gate electrode formation trench with the intermediary of a gate insulating film. The first stress film and the second stress film are each formed by using a film that has etch resistance against an etching species used in etching of the dummy gate pattern and the dummy gate insulating film. The first stress film is formed by using an insulating film that is superior to the second stress film in the etch resistance against the etching species.

In the method for manufacturing a semiconductor device according to this embodiment of the present invention, the first stress film is formed over the sidewall of the gate electrode with the intermediary of the sidewall insulating film, and the second stress film having the same type of stress as that of this first stress film is formed. This makes it possible to apply the stress of the first and second stress films to the channel region formed in the semiconductor substrate below the gate electrode.

For example, when the semiconductor device is a PMOS transistor, the mobility of the PMOS transistor can be enhanced if the stress of the first and second stress films is compressive stress.

When the semiconductor device is an NMOS transistor, the mobility of the NMOS transistor can be enhanced if the stress of the first and second stress films is tensile stress.

Furthermore, the first stress film and the second stress film have etch resistance against the etching species used in etching of a silicon oxide film, and the first stress film is formed by using an insulating film that is superior to the second stress film in the etch resistance against the etching species. Therefore, even if etching of a silicon oxide film is performed in the formation of the gate electrode formation trench, the first and second stress films are poorly etched by the etching species of this etching. In addition, even if the first and second stress films are etched, the degree of the etching of the first stress film is lower than that of the second stress film because the first stress film is superior to the second stress film in the etch resistance against the etching species.

Therefore, the first stress film is left close to the sidewall of the gate electrode. This makes it possible to surely apply the stress of the first stress film to the channel region formed in the semiconductor substrate below the gate electrode.

The semiconductor device according to the embodiment of the present invention allows suppression of the film thickness loss of the first stress film and effective application of the stress of the first stress film to the channel region of the transistor. Thus, this semiconductor device has an advantage that the mobility of the transistor can be surely enhanced.

The method for manufacturing a semiconductor device according to the embodiment of the present invention allows suppression of the film thickness loss of the first stress film and effective application of the stress of the first stress film to the channel region of the transistor. Thus, this method has an advantage that the mobility of the transistor can be surely enhanced.

BRIEF DESCRIPTION OF THE DRAWINGS

FIG. 1 is a sectional view showing the schematic structure of a semiconductor device according to one embodiment (first embodiment example) of the present invention;

DETAILED DESCRIPTION OF THE PREFERRED EMBODIMENTS

Figure 2:
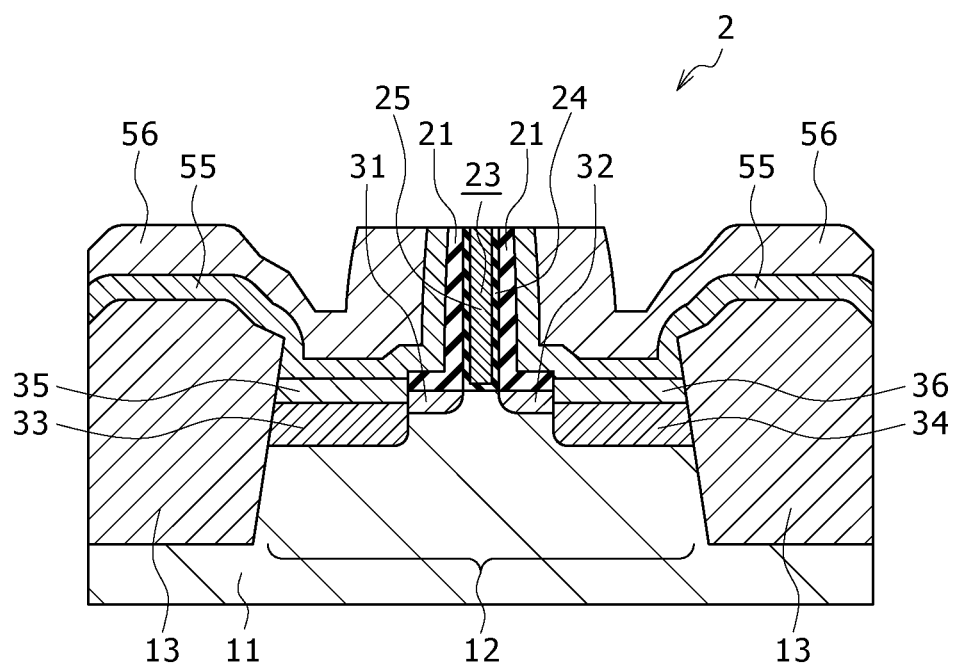
FIG. 2 is a sectional view showing the schematic structure of a semiconductor device according to one embodiment (second embodiment example) of the present invention.

A semiconductor device according to one embodiment (first embodiment example) of the present invention will be described below with reference to a sectional view of FIG. 1 showing the schematic structure.

As shown in FIG. 1, element isolation regions 13 by which an element formation region 12 is isolated are formed on a semiconductor substrate 11. On the element formation region 12 of the semiconductor substrate 11, a sidewall insulating film 21 having a gate electrode formation trench 23 formed therein is formed.

The semiconductor substrate 11 is formed of e.g. a silicon substrate, and the sidewall insulating film 21 is formed of e.g. a silicon nitride film.

Above the semiconductor substrate 11 inside the gate electrode formation trench 23, a gate electrode 25 is formed with the intermediary of a gate insulating film 24.

The gate insulating film 24 is formed of a high-k film having a dielectric constant higher than that of e.g. silicon oxide. For example, it is composed of a metal oxide, a metal oxide silicate, a metal oxynitride, or a nitrided metal oxide silicate of one kind of metal selected from hafnium (Hf), lanthanum (La), aluminum (Al), zirconium (Zn), and tantalum (Ta). As one example of the specific material, any of the following substances can be used: metal oxides such as hafnium oxide ($HfO_2$), aluminum oxide ($Al_2O_3$), and lanthanum oxide ($La_2O_3$); metal oxynitrides such as hafnium oxynitride (HfON) and aluminum oxynitride (AlON); metal oxide silicates such as hafnium silicate (HfSiO); and nitrided metal oxide silicates such as nitrided hafnium silicate (HfSiON).

Furthermore, as one example, the gate insulating film 24 may be a component obtained by stacking the above-described high-k insulating film on a silicon-based insulating film such as a silicon oxide film or a silicon nitride film.

For the gate electrode 25, any of e.g. the following materials is used: metals such as titanium (Ti), ruthenium (Ru), hafnium (Hf), iridium (Ir), tungsten (W), molybdenum (Mo), lanthanum (La), and nickel (Ni); silicon compounds of these metals; and metal compounds such as nitrogen compounds having electrical conductivity. In addition, polysilicon can also be used.

Between the gate insulating film 24 and the gate electrode 25, a close-coupled layer (not shown) composed of titanium nitride, titanium, or the like may be formed.

Lightly doped regions 31 and 32 are formed in the semiconductor substrate 11 under the sidewall insulating film 21 on both the sides of the gate electrode 25. The lightly doped regions 31 and 32 are referred to also as extension regions.

Furthermore, in the semiconductor substrate 11 on both the sides of the gate electrode 25, heavily doped regions 33 and 34 having impurity concentration higher than that of the lightly doped regions 31 and 32 are formed with the intermediary of the lightly doped regions 31 and 32. The lightly doped regions 31 and 32 and the heavily doped regions 33 and 34 serve as the source and drain regions.

Metal silicide layers 35 and 36 are formed on the heavily doped regions 33 and 34. The metal silicide layers 35 and 36 are composed of e.g. cobalt silicide, nickel silicide, or nickel-platinum silicide.

Over the semiconductor substrate 11, a first stress film 51 having stress (e.g. compressive stress) is formed over the sidewall of the gate electrode 25 with the intermediary of the sidewall insulating film 21. Furthermore, a second stress film 52 having the same type of stress as that of the first stress film 51 is formed over the semiconductor substrate 11 outside the first stress film 51.

The first stress film 51 and the second stress film 52 have etch resistance against the etching species used in etching of a silicon oxide film, and the first stress film 51 is superior to the second stress film 52 in the etch resistance against the etching species.

Specifically, the film density of the first stress film 51 is higher than that of the second stress film 52.

For example, the first stress film 51 has compressive stress in the range of 2.0 GPa to 3.0 GPa, and the second stress film 52 has compressive stress that is at least 1.0 GPa and lower than 2.0 GPa.

Examples of the first stress film 51 having such a compressive stress value include a silicon nitride film that contains carbon at a ratio in the range of 6 atomic % to 8 atomic %.

If the carbon concentration in the first stress film 51 is lower than 6 atomic %, it is impossible to achieve sufficient etch resistance against a wet etching liquid for silicon oxide, such as a dilute hydrofluoric acid. If the carbon concentration in the first stress film 51 is higher than 8 atomic %, the compressive stress in the film is too high and thus film separation will easily occur. Therefore, the carbon concentration in the first stress film 51 is set in the range of 6 atomic % to 8 atomic %.

Furthermore, the thickness of the first stress film 51 is set at least 5 nm and smaller than 30 nm for example.

If the thickness of the first stress film 51 is smaller than 5 nm, the degree of application of the compressive stress is low and the etching rate of the first stress film 51 is high. If the thickness of the first stress film 51 is 30 nm or larger, the degree of application of the compressive stress is too high and thus film separation will easily occur because the first stress film 51 has high compressive stress (in the range of 2.0 GPa to 3.0 GPa). Therefore, the thickness of the first stress film 51 is set at least 5 nm and smaller than 30 nm.

Based on the above-described conditions, the first stress film 51 (in the case of a compressive stress film) has high compressive stress in the range of 2.0 GPa to 3.0 GPa.

Examples of the second stress film 52 include a silicon nitride film that contains carbon at a ratio that is at least 1 atomic % and lower than 6 atomic %.

If the carbon concentration in the second stress film 52 is lower than 1 atomic %, it is impossible to achieve etch resistance against a wet etching liquid for silicon oxide, such as a dilute hydrofluoric acid. If the carbon concentration in the second stress film 52 is 6 atomic % or higher, the compressive stress in the film is too high with the thickness of the second stress film 52 and thus film separation will easily occur. Therefore, the carbon concentration in the second stress film 52 is set at least 1 atomic % and lower than 6 atomic %.

The thickness of the second stress film 52 formed of the silicon nitride film having compressive stress is set in the range of 30 nm to 70 nm for example.

If the thickness of the second stress film 52 is smaller than 30 nm, the degree of application of the compressive stress is low with the compressive stress of the second stress film 52. If the thickness of the second stress film 52 is larger than 70 nm, the degree of application of the compressive stress is too high and thus film separation will easily occur even with the compressive stress of the second stress film 52 (at least 1.0 GPa and lower than 2.0 GPa). In addition, it is sufficient that the total thickness of the first stress film 51 and the second stress film 52 is about 100 nm because the height of the gate electrode is about 100 nm. In view of these circumstances, the thickness of the second stress film 52 is set in the range of 30 nm to 70 nm.

Based on the above-described conditions, the second stress film 52 (in the case of a compressive stress film) has compressive stress that is at least 1.0 GPa and lower than 2.0 GPa.

The first stress film 51 as above has high etch resistance against the etching species for wet etching of a silicon oxide film. For example, if the etching species is a dilute hydrofluoric acid prepared at a dilution rate of 1:100, the etching rate of the first stress film 51 can be kept lower than about 0.2 nm/min.

In addition, the second stress film 52 as above has high etch resistance against the etching species for wet etching of a silicon oxide film. For example, if the etching species is a dilute hydrofluoric acid prepared at a dilution rate of 1:100, the etching rate of the second stress film 52 can be kept lower than about 0.3 nm/min. The etching rate of the first stress film 51 is set lower than that of the second stress film 52. Due to this feature, the first stress film 51 is obtained as an insulating film that is superior to the second stress film 52 in the etch resistance against the etching species for etching of silicon oxide.

In this semiconductor device 1 of the first embodiment example, the first stress film 51 and the second stress film 52 having the same type of stress as that of this first stress film 51 are formed over the sidewall of the gate electrode 25 with the intermediary of the sidewall insulating film 21. This makes it possible to apply the compressive stress of the first stress film 51 and the second stress film 52 to the channel region formed in the semiconductor substrate 11 below the gate electrode 25.

For example, if the semiconductor device 1 is a PMOS transistor, the mobility of the transistor is enhanced because the stress of the first stress film 51 and the second stress film 52 is compressive stress.

Furthermore, the first stress film 51 and the second stress film 52 have etch resistance against the etching species used in etching of a silicon oxide film, and the first stress film 51 is superior to the second stress film 52 in the etch resistance against the etching species. Therefore, even if etching of a silicon oxide film is performed in the formation of the gate electrode formation trench 23, the first stress film 51 and the second stress film 52 are poorly etched by the etching species of this etching. In addition, even if both the first stress film 51 and the second stress film 52 are etched, the degree of the etching of the first stress film 51 is lower than that of the second stress film 52 because the first stress film 51 is superior to the second stress film 52 in the etch resistance against the etching species.

Therefore, the film thickness loss of the first stress film 51 can be suppressed and thus the first stress film 51 is left close to the sidewall of the gate electrode 25. This makes it possible to surely apply the compressive stress of the first stress film 51 to the channel region formed in the semiconductor substrate 11 below the gate electrode 25. Moreover, the compressive stress of the second stress film 52 can also be applied to the channel region.

Consequently, the compressive stress of the first stress film 51 can be effectively applied to the channel region of the transistor, which provides an advantage that the mobility of the transistor can be surely enhanced.

A semiconductor device according to one embodiment (second embodiment example) of the present invention will be described below with reference to a sectional view of FIG. 2 showing the schematic structure.

As shown in FIG. 2, element isolation regions 13 by which an element formation region 12 is isolated are formed on a semiconductor substrate 11. On the element formation region 12 of the semiconductor substrate 11, a sidewall insulating film 21 having a gate electrode formation trench 23 formed therein is formed.

The semiconductor substrate 11 is formed of e.g. a silicon substrate, and the sidewall insulating film 21 is formed of e.g. a silicon nitride film.

Above the semiconductor substrate 11 inside the gate electrode formation trench 23, a gate electrode 25 is formed with the intermediary of a gate insulating film 24.

The gate insulating film 24 is formed of a high-k film having a dielectric constant higher than that of e.g. silicon oxide. For example, it is composed of a metal oxide, a metal oxide silicate, a metal oxynitride, or a nitrided metal oxide silicate of one kind of metal selected from hafnium (Hf), lanthanum (La), aluminum (Al), zirconium (Zn), and tantalum (Ta). As one example of the specific material, any of the following materials can be used: metal oxides such as hafnium oxide ($HfO_2$), aluminum oxide ($Al_2O_3$), and lanthanum oxide ($La_2O_3$); metal oxynitrides such as hafnium oxynitride (HfON) and aluminum oxynitride (AlON); metal oxide silicates such as hafnium silicate (HfSiO); and nitrided metal oxide silicates such as nitrided hafnium silicate (HfSiON).

Furthermore, as one example, the gate insulating film 24 may be a component obtained by stacking the above-described high-k insulating film on a silicon-based insulating film such as a silicon oxide film or a silicon nitride film.

For the gate electrode 25, any of e.g. the following materials is used: metals such as titanium (Ti), ruthenium (Ru), hafnium (Hf), iridium (Ir), tungsten (W), molybdenum (Mo), lanthanum (La), and nickel (Ni); silicon compounds of these metals; and metal compounds such as nitrogen compounds having electrical conductivity. In addition, polysilicon can also be used.

Between the gate insulating film 24 and the gate electrode 25, a close-coupled layer (not shown) composed of titanium nitride, titanium, or the like may be formed.

Lightly doped regions 31 and 32 are formed in the semiconductor substrate 11 under the sidewall insulating film 21 on both the sides of the gate electrode 25. The lightly doped regions 31 and 32 are referred to also as extension regions.

Furthermore, in the semiconductor substrate 11 on both the sides of the gate electrode 25, heavily doped regions 33 and 34 having impurity concentration higher than that of the lightly doped regions 31 and 32 are formed with the intermediary of the lightly doped regions 31 and 32. The lightly doped regions 31 and 32 and the heavily doped regions 33 and 34 serve as the source and drain regions.

Metal silicide layers 35 and 36 are formed on the heavily doped regions 33 and 34. The metal silicide layers 35 and 36 are composed of e.g. cobalt silicide, nickel silicide, or nickel-platinum silicide.

Over the semiconductor substrate 11, a first stress film 55 having stress (e.g. tensile stress) is formed over the sidewall of the gate electrode 25 with the intermediary of the sidewall insulating film 21. Furthermore, a second stress film 56 having the same type of stress as that of the first stress film 55 is formed over the semiconductor substrate 11 outside the first stress film 55.

The first stress film 55 and the second stress film 56 have etch resistance against the etching species used in etching of a silicon oxide film, and the first stress film 55 is superior to the second stress film 56 in the etch resistance against the etching species.

Specifically, the film density of the first stress film 55 is higher than that of the second stress film 56.

For example, the first stress film 55 has tensile stress that is higher than 1.6 GPa and at most 2.0 GPa, and the second stress film 56 has tensile stress in the range of 0.8 GPa to 1.6 GPa.

Examples of the first stress film 55 having such a tensile stress value include a silicon nitride film that contains hydrogen at a ratio lower than 12 atomic %.

If the hydrogen concentration in the first stress film 55 is 12 atomic % or higher, it is impossible to achieve sufficient etch resistance against a wet etching liquid for silicon oxide, such as a dilute hydrofluoric acid. Therefore, the hydrogen concentration in the first stress film 55 is set lower than 12 atomic %.

Furthermore, the thickness of the first stress film 55 is set at least 5 nm and smaller than 30 nm for example.

If the thickness of the first stress film 55 is smaller than 5 nm, the degree of application of the tensile stress is low and the etching rate of the first stress film 55 is high. If the thickness of the first stress film 55 is 30 nm or larger, the degree of application of the tensile stress is too high and thus cracks will easily occur because the first stress film 55 has high tensile stress (higher than 1.6 GPa and at most 2.0 GPa). Therefore, the thickness of the first stress film 55 is set at least 5 nm and smaller than 30 nm.

Examples of the second stress film 56 include a silicon nitride film that contains hydrogen at a ratio in the range of 12 atomic % to 25 atomic %.

If the hydrogen concentration in the second stress film 56 is higher than 25 atomic %, it is impossible to achieve etch resistance against a wet etching liquid for silicon oxide, such as a dilute hydrofluoric acid. If the hydrogen concentration in the second stress film 56 is lower than 12 atomic %, the tensile stress in the film is too high with the thickness of the second stress film 56 and thus cracks will easily occur. Therefore, the hydrogen concentration in the second stress film 56 is set in the range of 12 atomic % to 25 atomic %.

The thickness of the second stress film 56 formed of the silicon nitride film having tensile stress is set in the range of 30 nm to 70 nm for example.

If the thickness of the second stress film 56 is smaller than 30 nm, the degree of application of the tensile stress is low with the tensile stress of the second stress film 56. If the thickness of the second stress film 56 is larger than 70 nm, the degree of application of the tensile stress is too high and thus cracks will easily occur even with the tensile stress of the second stress film 56 (in the range of 0.8 GPa to 1.6 GPa). In addition, it is sufficient that the total thickness of the first stress film 55 and the second stress film 56 is about 100 nm because the height of the gate electrode is about 100 nm. In view of these circumstances, the thickness of the second stress film 56 is set in the range of 30 nm to 70 nm.

Based on the above-described conditions, the second stress film 56 (in the case of a tensile stress film) has tensile stress in the range of 0.8 GPa to 1.6 GPa.

The first stress film 55 as above has high etch resistance against the etching species for wet etching of a silicon oxide film. For example, if the etching species is a dilute hydrofluoric acid prepared at a dilution rate of 1:100, the etching rate of the first stress film 55 can be kept lower than about 0.2 nm/min.

In addition, the second stress film 56 as above has high etch resistance against the etching species for wet etching of a silicon oxide film. For example, if the etching species is a dilute hydrofluoric acid prepared at a dilution rate of 1:100, the etching rate of the second stress film 56 can be kept lower than about 0.3 nm/min. The etching rate of the first stress film 55 is set lower than that of the second stress film 56. Due to this feature, the first stress film 55 is obtained as an insulating film that is superior to the second stress film 56 in the etch resistance against the etching species for etching of silicon oxide.

In this semiconductor device 2 of the second embodiment example, the first stress film 55 and the second stress film 56 having the same type of stress as that of this first stress film 55 are formed over the sidewall of the gate electrode 25 with the intermediary of the sidewall insulating film 21. This makes it possible to apply the tensile stress of the first stress film 55 and the second stress film 56 to the channel region formed in the semiconductor substrate 11 below the gate electrode 25.

For example, if the semiconductor device 2 is an NMOS transistor, the mobility of the transistor is enhanced because the stress of the first stress film 55 and the second stress film 56 is tensile stress.

Furthermore, the first stress film 55 and the second stress film 56 have etch resistance against the etching species used in etching of a silicon oxide film, and the first stress film 55 is superior to the second stress film 56 in the etch resistance against the etching species. Therefore, even if etching of a silicon oxide film is performed in the formation of the gate electrode formation trench 23, the first stress film 55 and the second stress film 56 are poorly etched by the etching species of this etching. In addition, even if both the first stress film 55 and the second stress film 56 are etched, the degree of the etching of the first stress film 55 is lower than that of the second stress film 56 because the first stress film 55 is superior to the second stress film 56 in the etch resistance against the etching species.

Therefore, the film thickness loss of the first stress film 55 can be suppressed and thus the first stress film 55 is left close to the sidewall of the gate electrode 25. This makes it possible to surely apply the tensile stress of the first stress film 55 to the channel region formed in the semiconductor substrate 11 below the gate electrode 25. Moreover, the stress of the second stress film 56 can also be applied to the channel region.

Consequently, the tensile stress of the first stress film 55 can be effectively applied to the channel region of the transistor, which provides an advantage that the mobility of the transistor can be surely enhanced.

A method for manufacturing a semiconductor device according to one embodiment (first embodiment example) of the present invention will be described below with reference to sectional views of FIGS. 3A to 3F showing manufacturing steps.

Figure 3A:
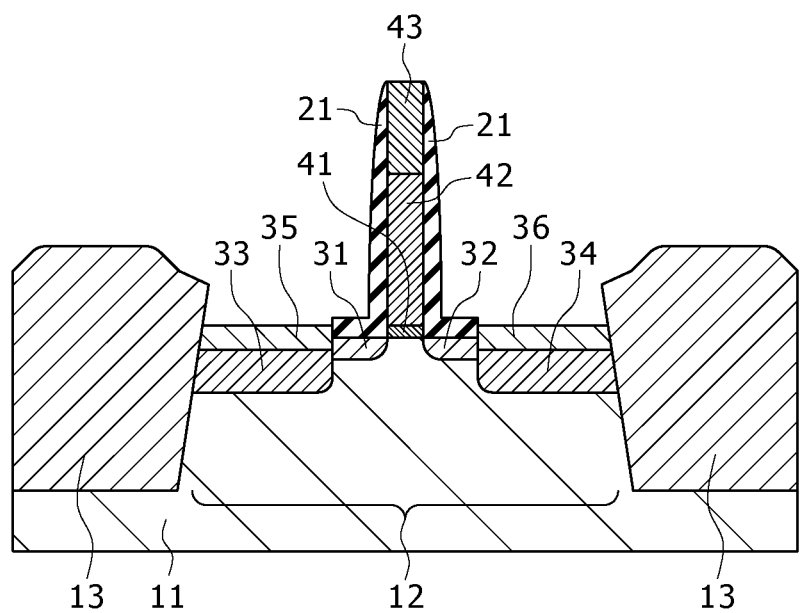
FIGS. 3A, 3B, 3C, 3D, 3E and 3F are sectional views showing manufacturing steps in a method for manufacturing a semiconductor device according to one embodiment (first embodiment example) of the present invention.

As shown in FIG. 3A, element isolation regions 13 by which an element formation region 12 is isolated are formed on a semiconductor substrate 11, and then a dummy gate pattern 42 is formed above the element formation region 12 of the semiconductor substrate 11 with the intermediary of a dummy gate insulating film 41. The dummy gate pattern 42 is formed of a poly-silicon film, and e.g. a silicon nitride film 43 may be formed thereon as a hard mask as shown in the drawing. The dummy gate insulating film 41 is formed of a silicon oxide film.

Lightly doped regions 31 and 32 are formed in the semiconductor substrate 11 on both the sides of the dummy gate pattern 42. The lightly doped regions 31 and 32 are referred to also as extension regions. A sidewall insulating film 21 is formed on the sidewall of the dummy gate pattern 42 on the lightly doped regions 31 and 32. This sidewall insulating film 21 is formed of a silicon nitride film.

Furthermore, in the semiconductor substrate 11 on both the sides of the dummy gate pattern 42, heavily doped regions 33 and 34 having impurity concentration higher than that of the lightly doped regions 31 and 32 are formed with the intermediary of the lightly doped regions 31 and 32. The lightly doped regions 31 and 32 and the heavily doped regions 33 and 34 serve as the source and drain regions.

Metal silicide layers 35 and 36 are formed on the heavily doped regions 33 and 34. The metal silicide layers 35 and 36 are composed of e.g. cobalt silicide, nickel silicide, or nickel-platinum silicide.

Figure 3B:
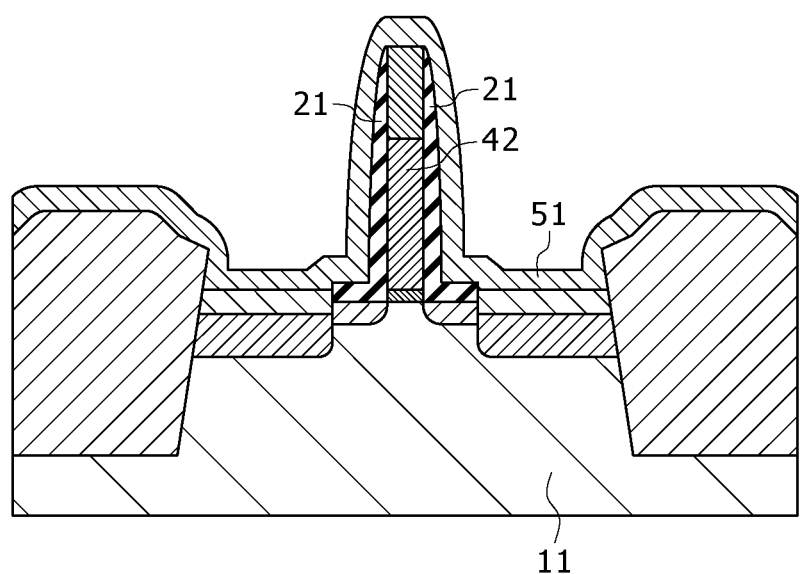

Subsequently, as shown in FIG. 3B, a first stress film 51 for applying stress to the channel region of the transistor is formed over the semiconductor substrate 11 in such a manner as to cover the dummy gate pattern 42, the sidewall insulating film 21, and so on. In general, this first stress film 51 is formed by using e.g. a silicon nitride film having tensile stress for an NMOS transistor, and is formed by using e.g. a silicon nitride film having compressive stress for a PMOS transistor. The following description will deal with the first stress film 51 having compressive stress.

The thickness of the first stress film 51 formed of the silicon nitride film having compressive stress is set at least 5 nm and smaller than 30 nm for example.

For example, a silicon nitride film having high compressive stress in the range of 2.0 GPa to 3.0 GPa is formed by film deposition with one example of the deposition condition, described below.

The silicon nitride film with such high compressive stress has high film density, and thus serves as a film having etch resistance against the etching species used in etching of silicon oxide.

One example of the film deposition condition of the first stress film 51 having the above-described compressive stress is as follows.

As the source gas, hydrogen ($H_2$), nitrogen ($N_2$), argon (Ar), ammonia ($NH_3$), and trimethylsilane ($SiH(CH_3)_3$: 3MS) are used.

The gas flow rate of hydrogen ($H_2$) is in the range of 1000 $cm^3$/min to 5000 $cm^3$/min.

The gas flow rate of nitrogen ($N_2$) is in the range of 500 $cm^3$/min to 2500 $cm^3$/min.

The gas flow rate of argon (Ar) is in the range of 1000 $cm^3$/min to 5000 $cm^3$/min.

The gas flow rate of ammonia ($NH_3$) is in the range of 50 $cm^3$/min to 200 $cm^3$/min.

The gas flow rate of trimethylsilane ($SiH(CH_3)_3$:3MS) is in the range of 50 $cm^3$/min to 100 $cm^3$/min.

The substrate temperature in the film deposition is in the range of 450° C. to 550° C.

The pressure of the film deposition atmosphere is in the range of 133 Pa to 667 Pa.

The RF power (high frequency) is in the range of 50 W to 100 W.

The RF power (low frequency) is in the range of 10 W to 50 W.

The first stress film 51 formed with this film deposition condition is obtained as a silicon nitride film that contains carbon at a ratio in the range of 6 atomic % to 8 atomic % and has high compressive stress in the range of 2.0 GPa to 3.0 GPa.

For example, the etching rate of the first stress film 51 can be kept lower than about 0.2 nm/min in wet etching with use of a dilute hydrofluoric acid prepared at a dilution rate of 1:100 as the etching species.

If the carbon concentration in the first stress film 51 is lower than 6 atomic %, it is impossible to achieve sufficient etch resistance against a wet etching liquid for silicon oxide, such as a dilute hydrofluoric acid. If the carbon concentration in the first stress film 51 is higher than 8 atomic %, the compressive stress in the film is too high and thus film separation will easily occur. Therefore, the carbon concentration in the first stress film 51 is set in the range of 6 atomic % to 8 atomic %.

If the thickness of the first stress film 51 is smaller than 5 nm, the degree of application of the compressive stress is low and the etching rate of the first stress film 51 is high. If the thickness of the first stress film 51 is 30 nm or larger, the degree of application of the compressive stress is too high and thus film separation will easily occur because the first stress film 51 has high compressive stress (in the range of 2.0 GPa to 3.0 GPa). Therefore, the thickness of the first stress film 51 is set at least 5 nm and smaller than 30 nm.

Based on the above-described conditions, the first stress film 51 (in the case of a compressive stress film) has high compressive stress in the range of 2.0 GPa to 3.0 GPa.

Figure 3C:
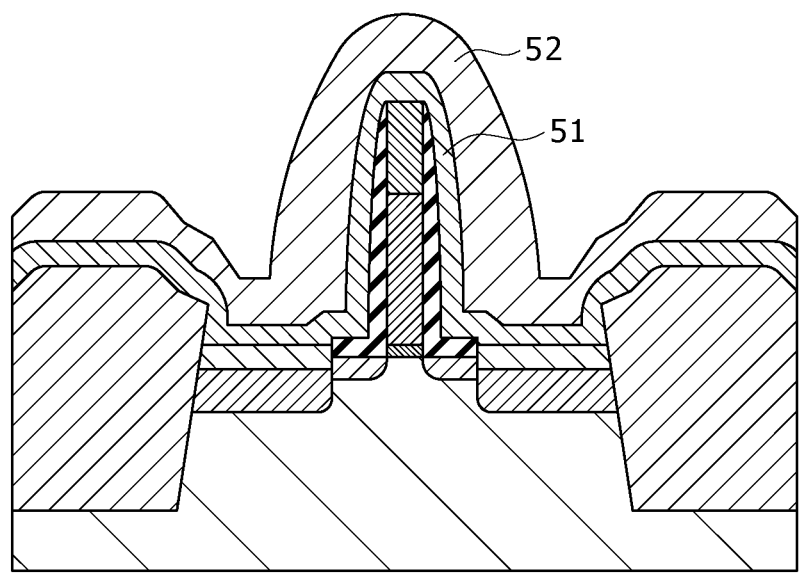

Subsequently, as shown in FIG. 3C, a second stress film 52 having compressive stress is formed on the first stress film 51. This second stress film 52 is formed of e.g. a silicon nitride film having compressive stress.

The thickness of the second stress film 52 formed of the silicon nitride film having compressive stress is set in the range of 30 nm to 70 nm for example.

For example, a silicon nitride film having compressive stress that is at least 1.0 GPa and lower than 2.0 GPa can be formed by film deposition with one example of the deposition condition, described below.

The silicon nitride film with such compressive stress has high film density, and thus serves as a film having etch resistance against the etching species used in etching of silicon oxide. The first stress film 51 is an insulating film that is superior to this second stress film 52 in the etch resistance against the etching species for etching of silicon oxide.

One example of the film deposition condition of the second stress film 52 having the above-described compressive stress is as follows.

As the source gas, hydrogen ($H_2$), nitrogen ($N_2$), argon (Ar), ammonia ($NH_3$), and trimethylsilane ($SiH(CH_3)_3$: 3MS) are used.

The gas flow rate of hydrogen ($H_2$) is in the range of 1000 $cm^3$/min to 5000 $cm^3$/min.

The gas flow rate of nitrogen ($N_2$) is in the range of 500 $cm^3$/min to 2500 $cm^3$/min.

The gas flow rate of argon (Ar) is in the range of 1000 cm$^3$/min to 5000 cm$^3$/min.

The gas flow rate of ammonia (NH$_3$) is in the range of 50 cm$^3$/min to 200 cm$^3$/min.

The gas flow rate of trimethylsilane (SiH(CH$_3$)$_3$:3MS) is at least 10 cm$^3$/min and lower than 50 cm$^3$/min.

The substrate temperature in the film deposition is in the range of 450° C. to 550° C.

The pressure of the film deposition atmosphere is in the range of 133 Pa to 667 Pa.

The RF power (high frequency) is in the range of 50 W to 100 W.

The RF power (low frequency) is in the range of 10 W to 50 W.

The second stress film 52 formed with this film deposition condition is obtained as a silicon nitride film that contains carbon at a ratio that is at least 1 atomic % and lower than 6 atomic % and has compressive stress that is at least 1.0 GPa and lower than 2.0 GPa.

For example, the etching rate of the second stress film 52 can be kept lower than about 0.3 nm/min in wet etching with use of a dilute hydrofluoric acid prepared at a dilution rate of 1:100 as the etching species.

If the carbon concentration in the second stress film 52 is lower than 1 atomic %, it is impossible to achieve etch resistance against a wet etching liquid for silicon oxide, such as a dilute hydrofluoric acid. If the carbon concentration in the second stress film 52 is 6 atomic % or higher, the compressive stress in the film is too high with the thickness of the second stress film 52 and thus film separation will easily occur. Therefore, the carbon concentration in the second stress film 52 is set at least 1 atomic % and lower than 6 atomic %.

If the thickness of the second stress film 52 is smaller than 30 nm, the degree of application of the compressive stress is low with the compressive stress of the second stress film 52. If the thickness of the second stress film 52 is larger than 70 nm, the degree of application of the compressive stress is too high and thus film separation will easily occur even with the compressive stress of the second stress film 52 (at least 1.0 GPa and lower than 2.0 GPa). In addition, it is sufficient that the total thickness of the first stress film 51 and the second stress film 52 is about 100 nm because the height of the gate electrode is about 100 nm. In view of these circumstances, the thickness of the second stress film 52 is set in the range of 30 nm to 70 nm.

Based on the above-described conditions, the second stress film 52 (in the case of a compressive stress film) has compressive stress that is at least 1.0 GPa and lower than 2.0 GPa.

Therefore, the first stress film 51 and the second stress film 52 are formed of films having etch resistance against the etching species used in etching of the dummy gate pattern 42 and the dummy gate insulating film 41. In addition, the first stress film 51 is formed of an insulating film that is superior to the second stress film 52 in the etch resistance against the etching species.

Figure 3D:
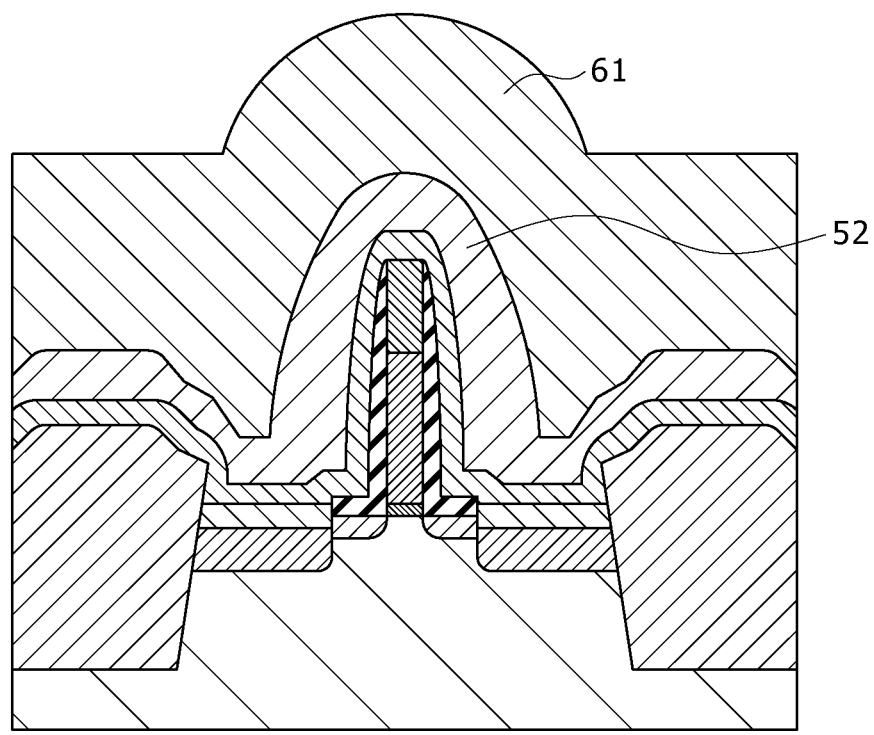

Subsequently, as shown in FIG. 3D, an insulating film 61 is formed on the second stress film 52. This insulating film 61 is referred to as e.g. a pre-metal deposition (PMD) film, and is formed of an oxide film such as a silicon oxide film or non-doped silicate glass (SA-NSG) manufactured by e.g. high-density plasma (HDP) Chemical vapor deposition (CVD).

Figure 3E:
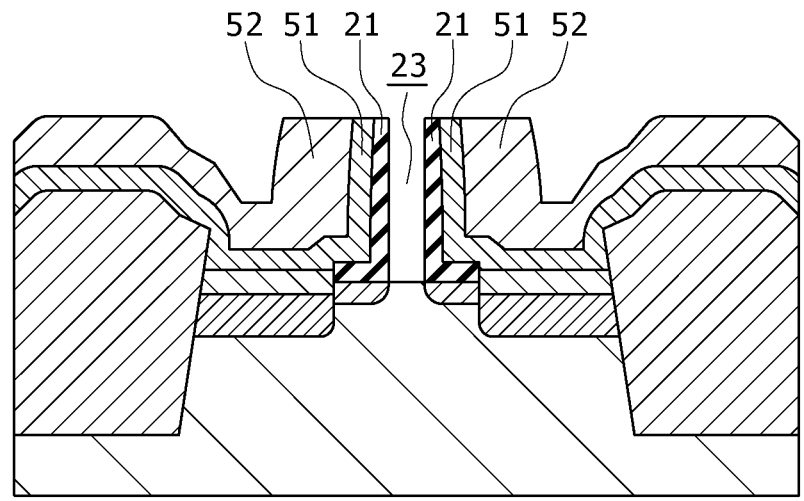

Referring next to FIG. 3E, upper part of the dummy gate pattern 42 (see FIGS. 3A and 3B) is exposed. Specifically, for example, the silicon nitride film 43 (see FIGS. 3A and 3B), the first stress film 51, the second stress film 52, the insulating film 61 (see FIG. 3D), and so on formed above the dummy gate pattern 42 are removed by chemical mechanical polishing (CMP) to thereby expose the dummy gate pattern 42.

In the chemical mechanical polishing, the surface of the insulating film 61 is planarized first. Furthermore, upper part and so on of the silicon nitride film 43, the first stress film 51, the second stress film 52, the insulating film 61, and the sidewall insulating film 21 are polished until upper part of the part composed of poly-silicon, of the dummy gate pattern 42, is exposed.

Subsequently, the dummy gate pattern 42 composed of poly-silicon is removed by dry etching. Moreover, the dummy gate insulating film 41 is removed by wet etching. In this wet etching, e.g. a dilute hydrofluoric acid (DHF) is used. In this case, the insulating film 61 composed of silicon oxide is also removed.

As a result, a gate electrode formation trench 23 is formed inside the sidewall insulating film 21.

In this wet etching, the stress film on the sidewall of the sidewall insulating film 21 is not etched differently from the related art because both the first stress film 51 and the second stress film 52 are formed of the silicon nitride film having wet-etching resistance and the first stress film 51 is superior to the second stress film 52 in the wet-etching resistance. Therefore, the film thickness loss of the first stress film 51 in the wet etching step of removing silicon oxide can be suppressed, which makes it possible to effectively apply stress to the channel region formed in the semiconductor substrate below the gate electrode formation trench 23.

In FIG. 3E, the state after the formation of the gate electrode formation trench 23 is shown.

Figure 3F:
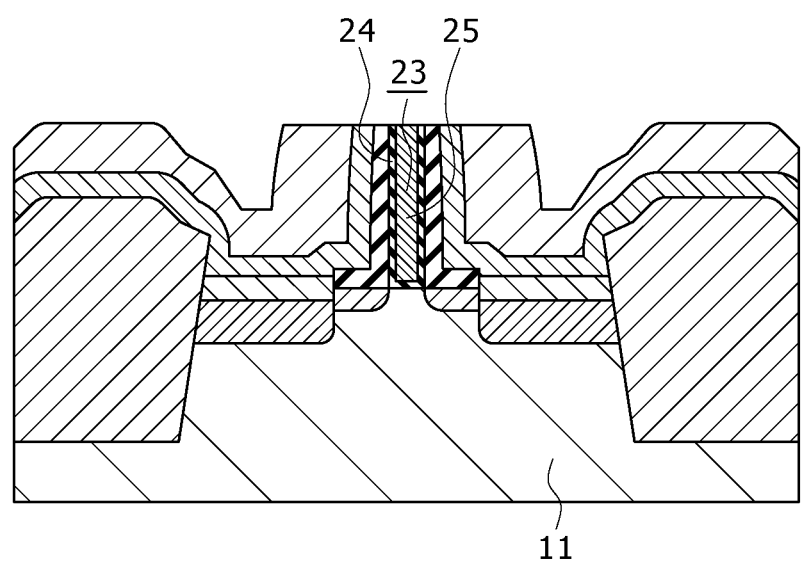

Subsequently, as shown in FIG. 3F, above the semiconductor substrate 11 inside the gate electrode formation trench 23, a gate electrode 25 is formed with the intermediary of a gate insulating film 24.

The gate insulating film 24 is formed by using a high-k film having a dielectric constant higher than that of e.g. silicon oxide. For example, it is formed by using a metal oxide, a metal oxide silicate, a metal oxynitride, or a nitrided metal oxide silicate of one kind of metal selected from hafnium (Hf), lanthanum (La), aluminum (Al), zirconium (Zn), and tantalum (Ta). As one example of the specific material, any of the following substances can be used: metal oxides such as hafnium oxide (HfO$_2$), aluminum oxide (Al$_2$O$_3$), and lanthanum oxide (La$_2$O$_3$); metal oxynitrides such as hafnium oxynitride (HfON) and aluminum oxynitride (AlON); metal oxide silicates such as hafnium silicate (HfSiO); and nitrided metal oxide silicates such as nitrided hafnium silicate (HfSiON).

Furthermore, as one example, the gate insulating film 24 may be a component obtained by stacking the above-described high-k insulating film on a silicon-based insulating film such as a silicon oxide film or a silicon nitride film.

For the gate electrode 25, any of e.g. the following materials is used: metals such as titanium (Ti), ruthenium (Ru), hafnium (Hf), iridium (Ir), tungsten (W), molybdenum (Mo), lanthanum (La), and nickel (Ni); silicon compounds of these metals; and metal compounds such as nitrogen compounds having electrical conductivity. In addition, poly-silicon can also be used.

Between the gate insulating film 24 and the gate electrode 25, a close-coupled layer (not shown) composed of titanium nitride, titanium, or the like may be formed.

In the manufacturing method of the first embodiment example, the first stress film 51 is formed over the sidewall of the gate electrode 25 with the intermediary of the sidewall insulating film 21, and the second stress film 52 having the same type of stress as that of this first stress film 51 is formed. This makes it possible to apply the stress of the first stress film 51 and the second stress film 52 to the channel region formed in the semiconductor substrate 11 below the gate electrode 25.

For example, when this semiconductor device 1 is a PMOS transistor, the mobility of the PMOS transistor can be enhanced if the stress of the first stress film 51 and the second stress film 52 is compressive stress.

Furthermore, the first stress film 51 and the second stress film 52 have etch resistance against the etching species used in etching of a silicon oxide film, such as a dilute hydrofluoric acid, and the first stress film 51 is formed by using an insulating film that is superior to the second stress film 52 in the etch resistance against the etching species. Therefore, in etching of a silicon oxide film in the formation of the gate electrode formation trench 23, the first stress film 51 and the second stress film 52 are poorly etched by the etching species of this etching. In addition, even if the first stress film 51 and the second stress film 52 are etched, the degree of the etching of the first stress film 51 is lower than that of the second stress film 52 because the first stress film 51 is superior to the second stress film 52 in the etch resistance against the etching species.

Therefore, the first stress film 51 is left close to the sidewall of the gate electrode 25. This makes it possible to surely apply the stress of the first stress film 51 to the channel region formed in the semiconductor substrate 11 below the gate electrode 25.

Thus, because the film thickness loss of the first stress film 51 can be suppressed, the stress of the first stress film 51 can be effectively applied to the channel region of the transistor, which provides an advantage that the mobility of the transistor can be surely enhanced.

In the manufacturing method of the first embodiment example, e.g. tetramethylsilane (4MS:Si(CH$_3$)$_4$) may be used instead of trimethylsilane as the source gas for the film deposition of the first stress film 51 and the second stress film 52. Also when tetramethylsilane (4MS:Si(CH$_3$)$_4$) is used instead of trimethylsilane, the same advantage as that of the above-described manufacturing method can be achieved.

A method for manufacturing a semiconductor device according to one embodiment (second embodiment example) of the present invention will be described below with reference to sectional views of FIGS. 4A to 4G showing manufacturing steps.

Figure 4A:
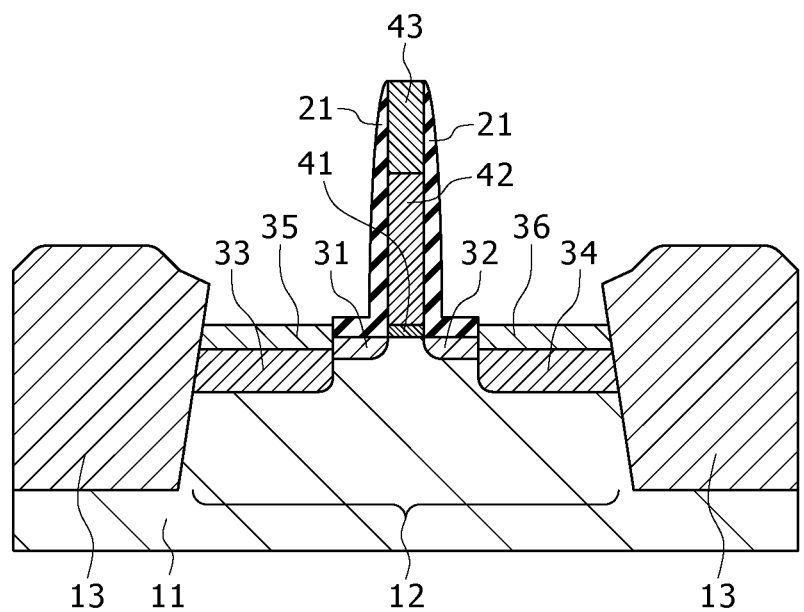
FIGS. 4A, 4B, 4C, 4D, 4E, 4F and 4G are sectional views showing manufacturing steps in a method for manufacturing a semiconductor device according to one embodiment (second embodiment example) of the present invention.

As shown in FIG. 4A, element isolation regions 13 by which an element formation region 12 is isolated are formed on a semiconductor substrate 11, and then a dummy gate pattern 42 is formed above the element formation region 12 of the semiconductor substrate 11 with the intermediary of a dummy gate insulating film 41. The dummy gate pattern 42 is formed of a poly-silicon film, and a silicon nitride film 43 may be formed thereon as shown in the drawing. The dummy gate insulating film 41 is formed of a silicon oxide film.

Lightly doped regions 31 and 32 are formed in the semiconductor substrate 11 on both the sides of the dummy gate pattern 42. The lightly doped regions 31 and 32 are referred to also as extension regions. A sidewall insulating film 21 is formed on the sidewall of the dummy gate pattern 42 above the lightly doped regions 31 and 32. This sidewall insulating film 21 is formed of a silicon nitride film.

Furthermore, in the semiconductor substrate 11 on both the sides of the dummy gate pattern 42, heavily doped regions 33 and 34 having impurity concentration higher than that of the lightly doped regions 31 and 32 are formed with the intermediary of the lightly doped regions 31 and 32. The lightly doped regions 31 and 32 and the heavily doped regions 33 and 34 serve as the source and drain regions.

Metal silicide layers 35 and 36 are formed on the heavily doped regions 33 and 34. The metal silicide layers 35 and 36 are composed of e.g. cobalt silicide, nickel silicide, or nickel-platinum silicide.

Figure 4B:
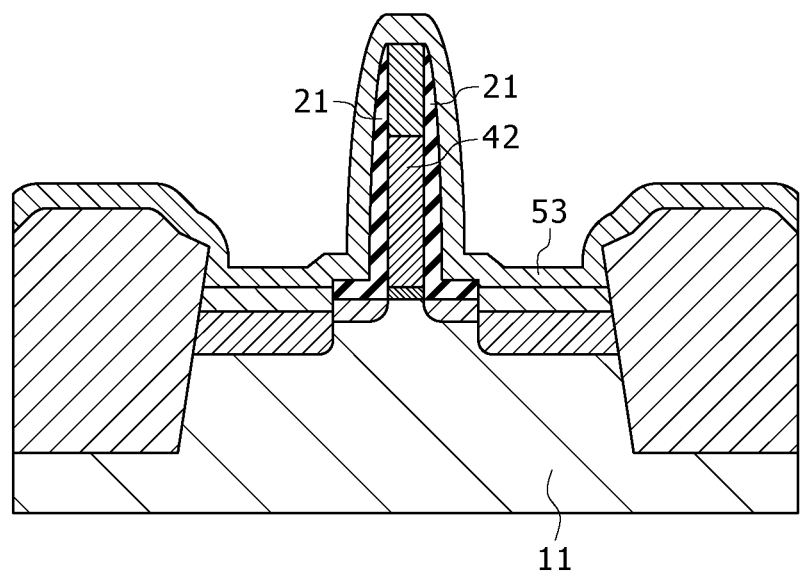

Subsequently, as shown in FIG. 4B, a first stress film to apply stress to the channel region of the transistor is formed over the semiconductor substrate 11 in such a manner as to cover the dummy gate pattern 42, the sidewall insulating film 21, and so on. In general, this first stress film is formed by using e.g. a silicon nitride film having tensile stress for an NMOS transistor, and is formed by using e.g. a silicon nitride film having compressive stress for a PMOS transistor. The following description will deal with the first stress film having compressive stress.

The thickness of the first stress film formed of the silicon nitride film having compressive stress is set at least 5 nm and smaller than 30 nm for example.

For example, a silicon nitride film having high compressive stress in the range of 2.0 GPa to 3.0 GPa can be formed by film deposition with one example of the deposition condition, described below.

The silicon nitride film with such high compressive stress has high film density, and thus serves as a film having etch resistance against the etching species used in etching of silicon oxide.

The first stress film is formed through the following steps.

Initially, a first stress initial film 53 to apply stress to the channel region of the transistor is formed over the semiconductor substrate 11 in such a manner as to cover the dummy gate pattern 42, the sidewall insulating film 21, and so on.

One example of the film deposition condition of the first stress initial film 53 is as follows.

As the source gas, hydrogen (H$_2$), nitrogen (N$_2$), argon (Ar), ammonia (NH$_3$), and trimethylsilane (SiH(CH$_3$)$_3$: 3MS) are used.

The gas flow rate of hydrogen (H$_2$) is in the range of 1000 cm$^3$/min to 5000 cm$^3$/min.

The gas flow rate of nitrogen (N$_2$) is in the range of 500 cm$^3$/min to 2500 cm$^3$/min.

The gas flow rate of argon (Ar) is in the range of 1000 cm$^3$/min to 5000 cm$^3$/min.

The gas flow rate of ammonia (NH$_3$) is in the range of 50 cm$^3$/min to 200 cm$^3$/min.

The gas flow rate of trimethylsilane (SiH(CH$_3$)$_3$:3MS) is at least 10 cm$^3$/min and lower than 50 cm$^3$/min.

The substrate temperature in the film deposition is in the range of 450° C. to 550° C.

The pressure of the film deposition atmosphere is in the range of 133 Pa to 667 Pa.

The RF power (high frequency) is in the range of 50 W to 100 W.

The RF power (low frequency) is in the range of 10 W to 50 W.

The first stress initial film 53 formed with this film deposition condition is obtained as a silicon nitride film that contains carbon at a ratio that is at least 1 atomic % and lower than 6 atomic % and has compressive stress that is at least 1.0 GPa and lower than 2.0 GPa.

For example, the etching rate of the first stress initial film 53 can be kept lower than about 0.3 nm/min in wet etching with use of a dilute hydrofluoric acid prepared at a dilution rate of 1:100 as the etching species.

Figure 4C:
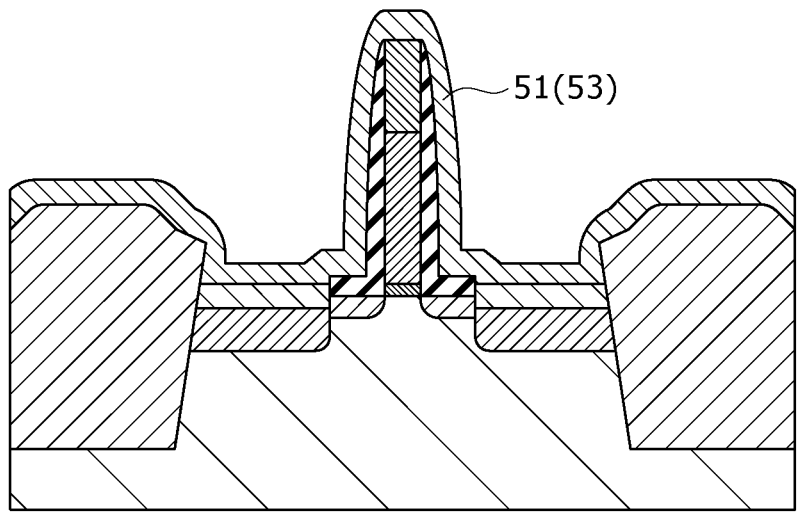

Subsequently, as shown in FIG. 4C, heat treatment is performed for the first stress initial film 53. One example of the heat treatment condition is as follows. A mixture gas atmosphere of nitrogen ($N_2$) and hydrogen ($H_2$) or a nitrogen atmosphere is employed as the heat treatment atmosphere.

The gas flow rate of nitrogen ($N_2$) is in the range of 5000 $cm^3$/min to 20000 $cm^3$/min.

The gas flow rate of hydrogen ($H_2$) is in the range of 0 $cm^3$/min to 20000 $cm^3$/min.

The gas flow rate of hydrogen may be 0 $cm^3$/min, i.e. the supply thereof may be absent. In this case, only nitrogen is employed as the heat treatment atmosphere.

The substrate temperature in the heat treatment is in the range of 450° C. to 550° C.

By this heat treatment, the hydrogen amount in the film is decreased, and the density of the film increases due to coupling of nitrogen in the heat treatment atmosphere with dangling bonds of silicon. Consequently, the compressive stress of the first stress initial film 53 is increased, so that the first stress initial film 53 becomes a first stress film 51 having a compressive stress value in the range of 2 GPa to 3 GPa.

A noble gas may be used in the heat treatment if only the decrease in the hydrogen amount in the film is intended.

The etching rate of the first stress film 51 can be kept lower than about 0.2 nm/min in wet etching with use of a dilute hydrofluoric acid prepared at a dilution rate of 1:100 as the etching species.

If the thickness of the first stress film 51 is smaller than 5 nm, the degree of application of the compressive stress is low and the etching rate of the first stress film 51 is high. If the thickness of the first stress film 51 is 30 nm or larger, the degree of application of the compressive stress is too high and thus film separation will easily occur because the first stress film 51 has high compressive stress (in the range of 2.0 GPa to 3.0 GPa). Therefore, the thickness of the first stress film 51 is set at least 5 nm and smaller than 30 nm.

Figure 4D:
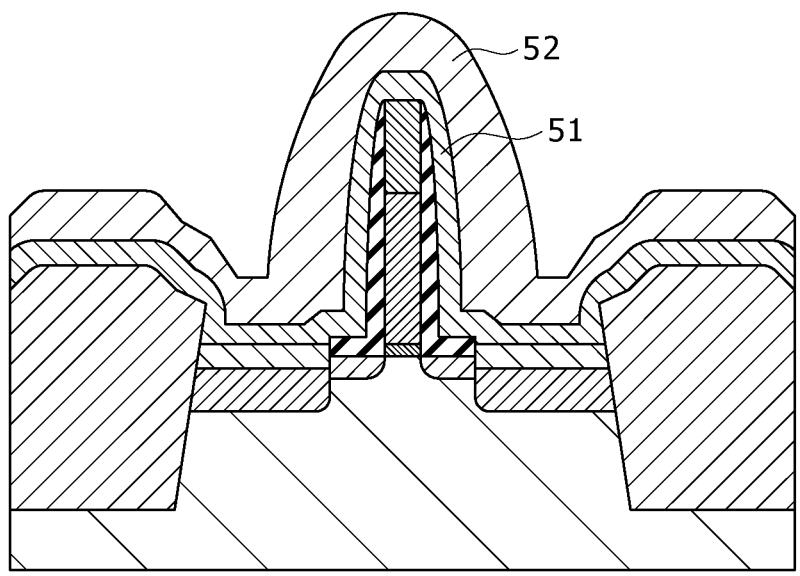

Subsequently, as shown in FIG. 4D, a second stress film 52 having compressive stress is formed on the first stress film 51. In the case of a PMOS transistor, this second stress film 52 is generally formed of e.g. a silicon nitride film having compressive stress. The following description will deal with the second stress film 52 having compressive stress.

The thickness of the second stress film 52 formed of the silicon nitride film having compressive stress is set in the range of 30 nm to 70 nm for example.

For example, a silicon nitride film having compressive stress that is at least 1.0 GPa and lower than 2.0 GPa can be formed by film deposition with one example of the deposition condition, described below.

The silicon nitride film with such compressive stress has high film density, and thus serves as a film having etch resistance against the etching species used in etching of silicon oxide. The first stress film 51 is an insulating film that is superior to this second stress film 52 in the etch resistance against the etching species for etching of silicon oxide.

One example of the film deposition condition of the second stress film 52 having the above-described compressive stress is as follows.

As the source gas, hydrogen ($H_2$), nitrogen ($N_2$), argon (Ar), ammonia ($NH_3$), and trimethylsilane ($SiH(CH_3)_3$: 3MS) are used.

The gas flow rate of hydrogen ($H_2$) is in the range of 1000 $cm^3$/min to 5000 $cm^3$/min.

The gas flow rate of nitrogen ($N_2$) is in the range of 500 $cm^3$/min to 2500 $cm^3$/min.

The gas flow rate of argon (Ar) is in the range of 1000 $cm^3$/min to 5000 $cm^3$/min.

The gas flow rate of ammonia ($NH_3$) is in the range of 50 $cm^3$/min to 200 $cm^3$/min.

The gas flow rate of trimethylsilane ($SiH(CH_3)_3$:3MS) is at least 10 $cm^3$/min and lower than 50 $cm^3$/min.

The substrate temperature in the film deposition is in the range of 450° C. to 550° C.

The pressure of the film deposition atmosphere is in the range of 133 Pa to 667 Pa.

The RF power (high frequency) is in the range of 50 W to 100 W.

The RF power (low frequency) is in the range of 10 W to 50 W.

The second stress film 52 formed with this film deposition condition is obtained as a silicon nitride film that contains carbon at a ratio that is at least 1 atomic % and lower than 6 atomic % and has compressive stress that is at least 1.0 GPa and lower than 2.0 GPa.

For example, the etching rate of the second stress film 52 can be kept lower than about 0.3 nm/min in wet etching with use of a dilute hydrofluoric acid prepared at a dilution rate of 1:100 as the etching species.

If the carbon concentration in the second stress film 52 is lower than 1 atomic %, it is impossible to achieve etch resistance against a wet etching liquid for silicon oxide, such as a dilute hydrofluoric acid. If the carbon concentration in the second stress film 52 is 6 atomic % or higher, the compressive stress in the film is too high with the thickness of the second stress film 52 and thus film separation will easily occur. Therefore, the carbon concentration in the second stress film 52 is set at least 1 atomic % and lower than 6 atomic %.

If the thickness of the second stress film 52 is smaller than 30 nm, the degree of application of the compressive stress is low with the compressive stress of the second stress film 52. If the thickness of the second stress film 52 is larger than 70 nm, the degree of application of the compressive stress is too high and thus film separation will easily occur even with the compressive stress of the second stress film 52 (at least 1.0 GPa and lower than 2.0 GPa). In addition, it is sufficient that the total thickness of the first stress film 51 and the second stress film 52 is about 100 nm because the height of the gate electrode is about 100 nm. In view of these circumstances, the thickness of the second stress film 52 is set in the range of 30 nm to 70 nm.

Based on the above-described conditions, the second stress film 52 (in the case of a compressive stress film) has compressive stress that is at least 1.0 GPa and lower than 2.0 GPa.

Therefore, the first stress film 51 and the second stress film 52 are formed of films having etch resistance against the etching species used in etching of the dummy gate pattern 42 and the dummy gate insulating film 41. In addition, the first stress film 51 is formed of an insulating film that is superior to the second stress film 52 in the etch resistance against the etching species.

Figure 4E:
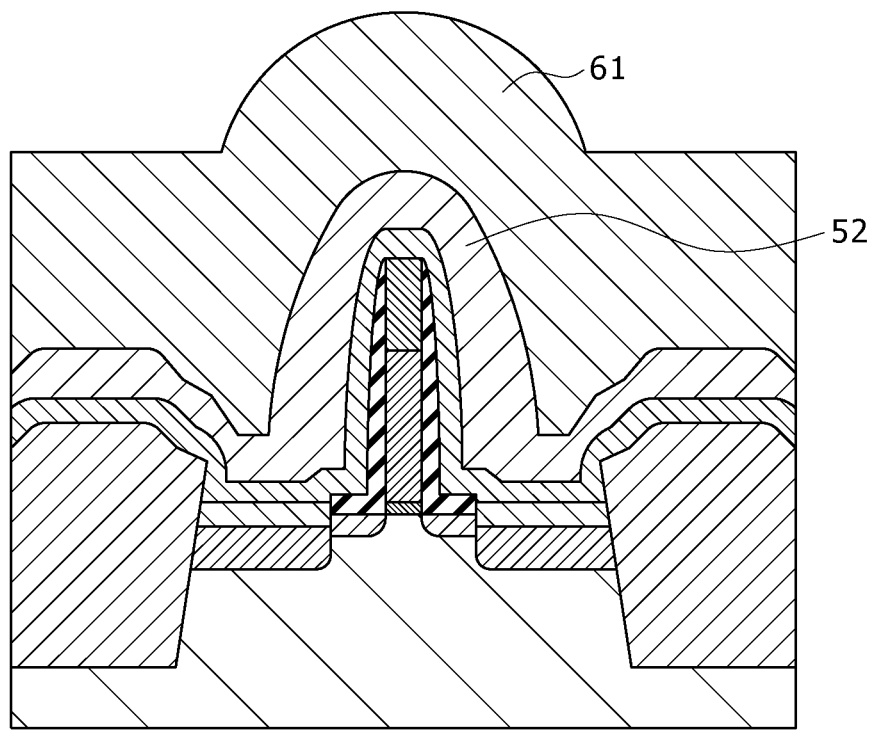

Subsequently, as shown in FIG. 4E, an insulating film 61 is formed on the second stress film 52. This insulating film 61 is referred to as e.g. a pre-metal deposition (PMD) film, and is formed of an oxide film such as a silicon oxide film or non-doped silicate glass (SA-NSG) manufactured by e.g. high-density plasma (HDP) CVD.

Figure 4F:
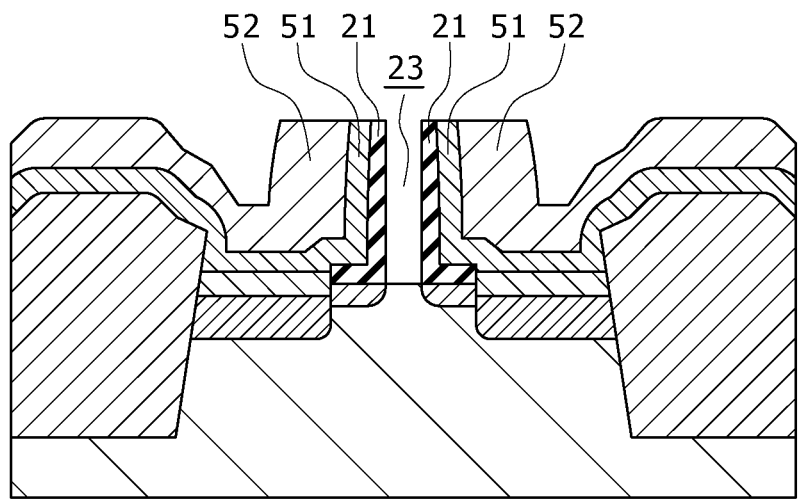

Referring next to FIG. 4F, upper part of the part composed of poly-silicon, of the dummy gate pattern 42 (see FIGS. 4A and 4B), is exposed. Specifically, for example, the silicon nitride film 43 (see FIGS. 4A and 4B), the first stress film 51, the second stress film 52, the insulating film 61 (see FIG. 4E), and so on formed above the poly-silicon of the dummy gate pattern 42 are removed by chemical mechanical polishing (CMP) to thereby expose the poly-silicon of the dummy gate pattern 42.

In the chemical mechanical polishing, the surface of the insulating film 61 is planarized first. Furthermore, upper part and so on of the silicon nitride film 43, the first stress film 51, the second stress film 52, the insulating film 61, and the sidewall insulating film 21 are polished until upper part of the part composed of poly-silicon, of the dummy gate pattern 42, is exposed.

Subsequently, the dummy gate pattern 42 (see FIG. 4A) composed of poly-silicon is removed by dry etching. Moreover, the dummy gate insulating film 41 (see FIG. 4A) is removed by wet etching. In this wet etching, e.g. a dilute hydrofluoric acid (DHF) is used. In this case, the insulating film 61 (see FIG. 4E) composed of silicon oxide is also removed.

As a result, a gate electrode formation trench 23 is formed inside the sidewall insulating film 21.

In this wet etching, the stress film on the sidewall of the sidewall insulating film 21 is not etched differently from the related art because both the first stress film 51 and the second stress film 52 are formed of the silicon nitride film having wet-etching resistance and the first stress film 51 is superior to the second stress film 52 in the wet-etching resistance. Therefore, the film thickness loss of the first stress film 51 in the wet etching step of removing silicon oxide can be suppressed, which makes it possible to effectively apply stress to the channel region formed in the semiconductor substrate below the gate electrode formation trench 23.

Figure 4G:
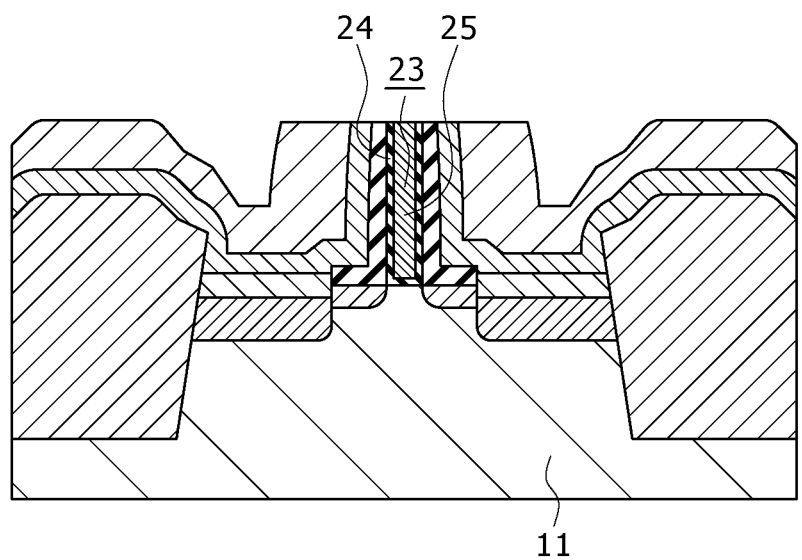

Subsequently, as shown in FIG. 4G, above the semiconductor substrate 11 inside the gate electrode formation trench 23, a gate electrode 25 is formed with the intermediary of a gate insulating film 24.

The gate insulating film 24 is formed by using a high-k film having a dielectric constant higher than that of e.g. silicon oxide. For example, it is formed by using a metal oxide, a metal oxide silicate, a metal oxynitride, or a nitrided metal oxide silicate of one kind of metal selected from hafnium (Hf), lanthanum (La), aluminum (Al), zirconium (Zn), and tantalum (Ta). As one example of the specific material, any of the following substances can be used: metal oxides such as hafnium oxide ($HfO_2$), aluminum oxide ($Al_2O_3$), and lanthanum oxide ($La_2O_3$); metal oxynitrides such as hafnium oxynitride (HfON) and aluminum oxynitride (AlON); metal oxide silicates such as hafnium silicate (HfSiO); and nitrided metal oxide silicates such as nitrided hafnium silicate (HfSiON).

Furthermore, as one example, the gate insulating film 24 may be a component obtained by stacking the above-described high-k insulating film on a silicon-based insulating film such as a silicon oxide film or a silicon nitride film.

For the gate electrode 25, any of e.g. the following materials is used: metals such as titanium (Ti), ruthenium (Ru), hafnium (Hf), iridium (Ir), tungsten (W), molybdenum (Mo), lanthanum (La), and nickel (Ni); silicon compounds of these metals; and metal compounds such as nitrogen compounds having electrical conductivity. In addition, polysilicon can also be used.

Between the gate insulating film 24 and the gate electrode 25, a close-coupled layer (not shown) composed of titanium nitride, titanium, or the like may be formed.

In the manufacturing method of the second embodiment example, the first stress film 51 is formed over the sidewall of the gate electrode 25 with the intermediary of the sidewall insulating film 21, and the second stress film 52 having the same type of stress as that of this first stress film 51 is formed. This makes it possible to apply the stress of the first stress film 51 and the second stress film 52 to the channel region formed in the semiconductor substrate 11 below the gate electrode 25.

For example, when this semiconductor device 1 is a PMOS transistor, the mobility of the PMOS transistor can be enhanced if the stress of the first stress film 51 and the second stress film 52 is compressive stress.

Furthermore, the first stress film 51 and the second stress film 52 have etch resistance against the etching species used in etching of a silicon oxide film, such as a dilute hydrofluoric acid, and the first stress film 51 is formed by using an insulating film that is superior to the second stress film 52 in the etch resistance against the etching species. Therefore, in etching of a silicon oxide film in the formation of the gate electrode formation trench 23, the first stress film 51 and the second stress film 52 are poorly etched by the etching species of this etching. In addition, even if the first stress film 51 and the second stress film 52 are etched, the degree of the etching of the first stress film 51 is lower than that of the second stress film 52 because the first stress film 51 is superior to the second stress film 52 in the etch resistance against the etching species.

Therefore, the first stress film 51 is left close to the sidewall of the gate electrode 25. This makes it possible to surely apply the stress of the first stress film 51 to the channel region formed in the semiconductor substrate 11 below the gate electrode 25.

Thus, because the film thickness loss of the first stress film 51 can be suppressed, the stress of the first stress film 51 can be effectively applied to the channel region of the transistor, which provides an advantage that the mobility of the transistor can be surely enhanced.

In the manufacturing method of the second embodiment example, e.g. tetramethylsilane ($4MS:Si(CH_3)_4$) may be used instead of trimethylsilane as the source gas for the film deposition of the first stress film 51 and the second stress film 52. Also when tetramethylsilane ($4MS:Si(CH_3)_4$) is used instead of trimethylsilane, the same advantage as that of the above-described manufacturing method can be achieved.

A method for manufacturing a semiconductor device according to one embodiment (third embodiment example) of the present invention will be described below.

The manufacturing method of the third embodiment example is equivalent to a method in which heat treatment is performed after the formation of the first stress film 51 in the manufacturing method of the first embodiment example. Except for this heat treatment, the manufacturing method of the third embodiment example is the same as that of the first embodiment example.

One example of the heat treatment condition in the third embodiment example is as follows. A mixture gas atmosphere of nitrogen ($N_2$) and hydrogen ($H_2$) or a nitrogen atmosphere is employed as the heat treatment atmosphere.

The gas flow rate of nitrogen ($N_2$) is in the range of 5000 $cm^3/min$ to 20000 $cm^3/min$.

The gas flow rate of hydrogen ($H_2$) is in the range of 0 $cm^3/min$ to 20000 $cm^3/min$.

The gas flow rate of hydrogen may be 0 $cm^3/min$, i.e. the supply thereof may be absent. In this case, only nitrogen is employed as the heat treatment atmosphere.

The substrate temperature in the heat treatment is in the range of 450° C. to 550° C.

By this heat treatment, the hydrogen amount in the first stress film 51 is decreased, and the film density thereof increases due to coupling of nitrogen in the heat treatment atmosphere with dangling bonds of silicon. Consequently, the compressive stress is increased, so that the first stress film 51 becomes a film having a larger compressive stress value.

A noble gas may be used in the heat treatment if only the decrease in the hydrogen amount in the film is intended.

This heat treatment should be so performed that the compressive stress value of the first stress film 51 will not become too large. If the compressive stress value of the first stress film 51 surpasses 3.0 GPa, film separation possibly occurs as described above. Therefore, the heat treatment is so performed that the compressive stress value of the first stress film 51 will be at most 3.0 GPa.

Due to this heat treatment, the etching rate of the first stress film 51 can be kept lower than about 0.2 nm/min in wet etching with use of a dilute hydrofluoric acid prepared at a dilution rate of 1:100 as the etching species.

The manufacturing method of the third embodiment example can also achieve the same advantage as that of the manufacturing method of the first embodiment example.

In the above description, one example of a PMOS transistor is employed as the semiconductor device. However, manufacturing methods according to embodiments of the present invention can be applied also to an NMOS transistor. One example of the embodiment applied to an NMOS transistor will be described below as a method for manufacturing a semiconductor device according to one embodiment (fourth embodiment example) of the present invention, with reference to sectional views of FIGS. 10 to 13 showing manufacturing steps.

Figure 5A:
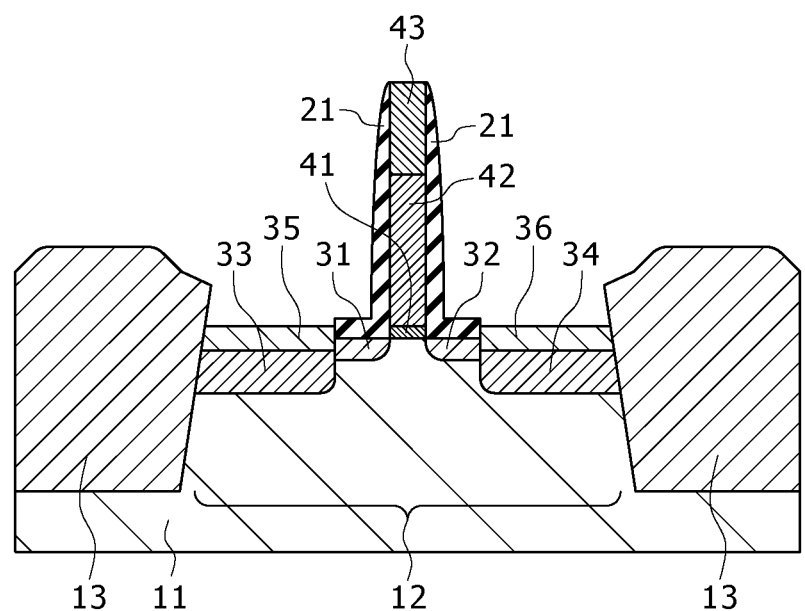
FIGS. 5A, 5B, 5C, 5D, 5E, 5F, 5G and 5H are sectional views showing manufacturing steps in a method for manufacturing a semiconductor device according to one embodiment (fourth embodiment example) of the present invention.

As shown in FIG. 5A, element isolation regions 13 by which an element formation region 12 is isolated are formed on a semiconductor substrate 11, and then a dummy gate pattern 42 is formed above the element formation region 12 of the semiconductor substrate 11 with the intermediary of a dummy gate insulating film 41. The dummy gate pattern 42 is formed of a poly-silicon film, and a silicon nitride film 43 may be formed thereon as shown in the drawing. The dummy gate insulating film 41 is formed of a silicon oxide film.

Lightly doped regions 31 and 32 are formed in the semiconductor substrate 11 on both the sides of the dummy gate pattern 42. The lightly doped regions 31 and 32 are referred to also as extension regions. A sidewall insulating film 21 is formed on the sidewall of the dummy gate pattern 42 above the lightly doped regions 31 and 32. This sidewall insulating film 21 is formed of a silicon nitride film.

Furthermore, in the semiconductor substrate 11 on both the sides of the dummy gate pattern 42, heavily doped regions 33 and 34 having impurity concentration higher than that of the lightly doped regions 31 and 32 are formed with the intermediary of the lightly doped regions 31 and 32. The lightly doped regions 31 and 32 and the heavily doped regions 33 and 34 serve as the source and drain regions.

Metal silicide layers 35 and 36 are formed on the heavily doped regions 33 and 34. The metal silicide layers 35 and 36 are composed of e.g. cobalt silicide, nickel silicide, or nickel-platinum silicide.

Figure 5B:
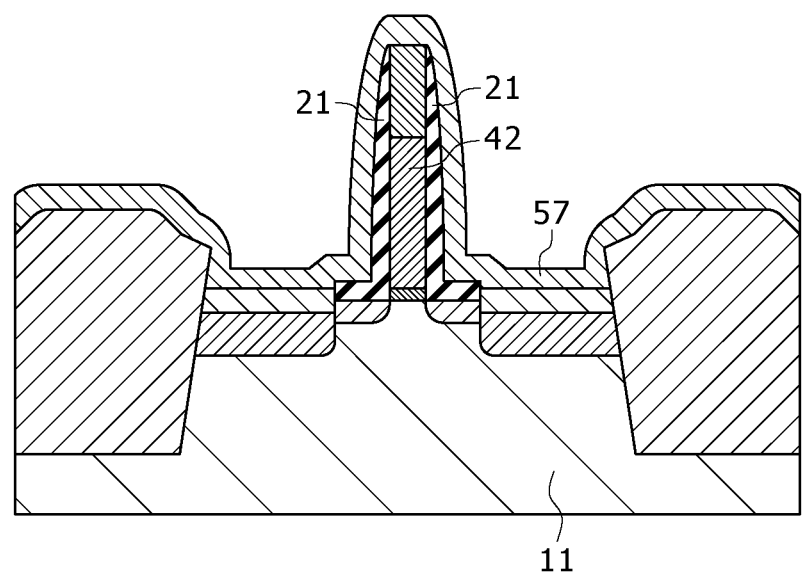

Subsequently, as shown in FIG. 5B, a first stress film to apply stress to the channel region of the transistor is formed over the semiconductor substrate 11 in such a manner as to cover the dummy gate pattern 42, the sidewall insulating film 21, and so on. In general, this first stress film is formed by using e.g. a silicon nitride film having tensile stress for an NMOS transistor, and is formed by using e.g. a silicon nitride film having compressive stress for a PMOS transistor. The following description will deal with the first stress film having tensile stress.

The thickness of the first stress film formed of the silicon nitride film having tensile stress is set at least 5 nm and smaller than 30 nm for example.

For example, a silicon nitride film having high tensile stress that is higher than 1.6 GPa and at most 2.0 GPa is formed by film deposition with one example of the deposition condition, described below.

The silicon nitride film with such high tensile stress has high film density, and thus serves as a film having etch resistance against the etching species used in etching of silicon oxide.

The first stress film is formed through the following steps.

Initially, a first stress initial film 57 to apply stress to the channel region of the transistor is formed over the semiconductor substrate 11 in such a manner as to cover the dummy gate pattern 42, the sidewall insulating film 21, and so on.

One example of the film deposition condition of the first stress initial film 57 is as follows.

As the source gas, nitrogen ($N_2$), ammonia ($NH_3$), and monosilane ($SiH_4$) are used.

The gas flow rate of nitrogen ($N_2$) is in the range of 500 $cm^3$/min to 2000 $cm^3$/min.

The gas flow rate of ammonia ($NH_3$) is in the range of 500 $cm^3$/min to 1500 $cm^3$/min.

The gas flow rate of monosilane ($SiH_4$) is in the range of 50 $cm^3$/min to 300 $cm^3$/min.

The substrate temperature in the film deposition is in the range of 250° C. to 350° C.

The pressure of the film deposition atmosphere is in the range of 667 Pa to 2.0 kPa.

The RF power (high frequency) is in the range of 50 W to 150 W.

The RF power (low frequency) is 0 W.

Figure 5C:
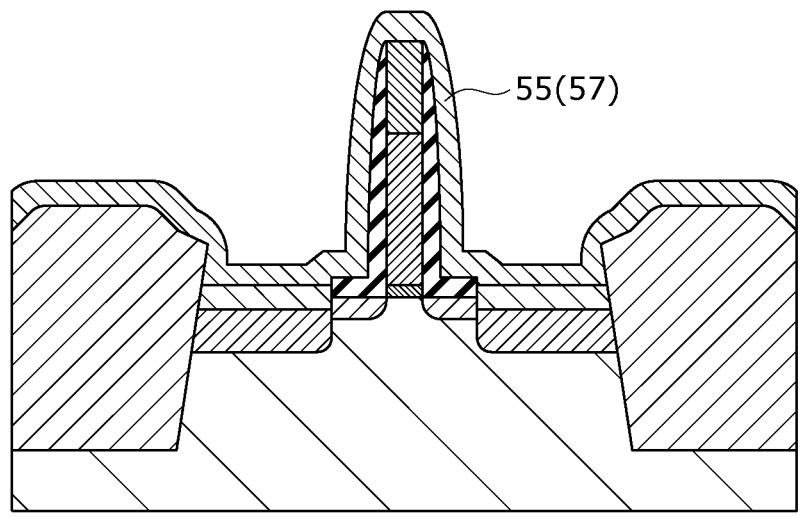

Subsequently, as shown in FIG. 5C, ultraviolet (UV) curing treatment is performed for the first stress initial film 57. One example of the condition of this UV curing treatment is as follows.

Single-wafer UV curing treatment apparatus (for 200 mm wafers) is used.

A helium (He) atmosphere or another noble gas atmosphere is employed as the atmosphere of the UV curing treatment.

The gas flow rate of helium (He) is in the range of 10 L/min to 20 L/min.

The substrate temperature in the UV curing treatment is in the range of 450° C. to 550° C.

The atmosphere pressure of the UV curing treatment is in the range of 0.67 kPa to 1.3 kPa.

The UV lamp power is in the range of 1 kW to 10 kW.

By this UV curing treatment, the number of silicon-hydrogen bonds in the first stress initial film 57 is reduced, so that the first stress initial film 57 becomes a first stress film 55 having tensile stress and higher film density.

The first stress film 55 formed with the above-described film deposition condition is obtained as a silicon nitride film that contains hydrogen at a ratio lower than 12 atomic % and has high tensile stress that is higher than 1.6 GPa and at most 2.0 GPa.

For example, the etching rate of the first stress film 55 can be kept lower than about 0.2 nm/min in wet etching with use of a dilute hydrofluoric acid prepared at a dilution rate of 1:100 as the etching species.

If the hydrogen concentration in the first stress film 55 is 12 atomic % or higher, it is impossible to achieve sufficient etch resistance against a wet etching liquid for silicon oxide, such as a dilute hydrofluoric acid. Therefore, the hydrogen concentration in the first stress film 55 is set lower than 12 atomic %.

If the thickness of the first stress film 55 is smaller than 5 nm, the degree of application of the tensile stress is low and the etching rate of the first stress film 55 is high. If the thickness of the first stress film 55 is 30 nm or larger, the degree of application of the tensile stress is too high and thus cracks will easily occur because the first stress film 55 has high tensile stress (higher than 1.6 GPa and at most 2.0 GPa). Therefore, the thickness of the first stress film 55 is set at least 5 nm and smaller than 30 nm.

Figure 5D:
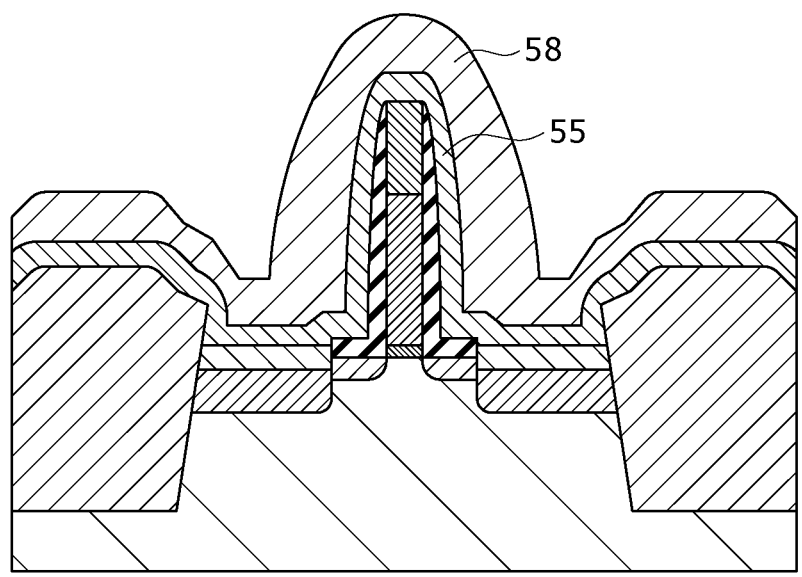

Subsequently, as shown in FIG. 5D, a second stress film having tensile stress is formed on the first stress film 55. In the case of an NMOS transistor, this second stress film is generally formed of e.g. a silicon nitride film having tensile stress. The following description will deal with the second stress film having tensile stress.

The thickness of the second stress film formed of the silicon nitride film having tensile stress is set in the range of 30 nm to 70 nm for example.

For example, a silicon nitride film having tensile stress in the range of 0.8 GPa to 1.6 GPa can be formed by film deposition with one example of the deposition condition, described below.

The silicon nitride film with such tensile stress has high film density, and thus serves as a film having etch resistance against the etching species used in etching of silicon oxide. The first stress film 55 is an insulating film that is superior to this second stress film 56 in the etch resistance against the etching species for etching of silicon oxide.

The second stress film is formed through the following steps.

Initially, a second stress initial film 58 to apply stress to the channel region of the transistor is formed on the first stress film 55.

One example of the film deposition condition of the second stress initial film 58 is as follows.

As the source gas, nitrogen ($N_2$), ammonia ($NH_3$), and monosilane ($SiH_4$) are used.

The gas flow rate of nitrogen ($N_2$) is in the range of 500 $cm^3$/min to 2000 $cm^3$/min.

The gas flow rate of ammonia ($NH_3$) is in the range of 500 $cm^3$/min to 1500 $cm^3$/min.

The gas flow rate of monosilane ($SiH_4$) is in the range of 50 $cm^3$/min to 300 $cm^3$/min.

The substrate temperature in the film deposition is in the range of 250° C. to 350° C.

The pressure of the film deposition atmosphere is in the range of 667 Pa to 2.0 kPa.

The RF power (high frequency) is in the range of 50 W to 150 W.

The RF power (low frequency) is 0 W.

Figure 5E:
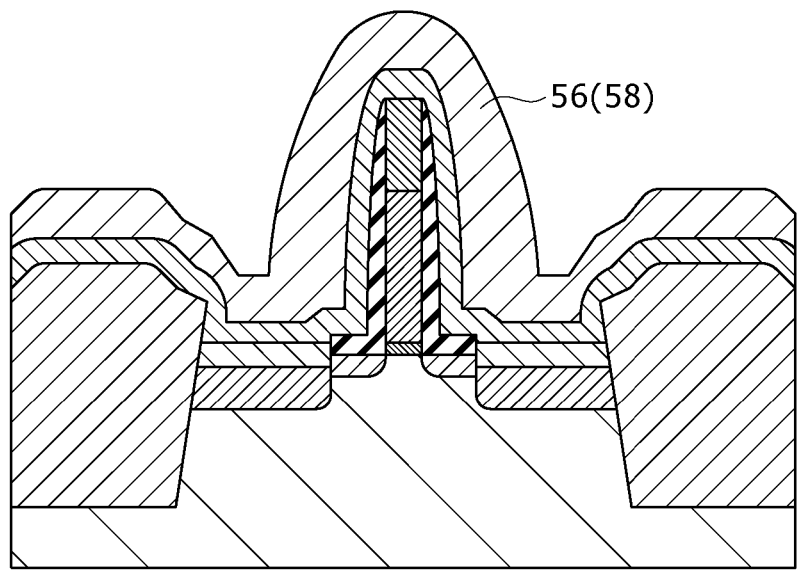

Subsequently, as shown in FIG. 5E, UV curing treatment is performed for the second stress initial film 58. One example of the condition of this UV curing treatment is as follows.

Single-wafer UV curing treatment apparatus (for 200 mm wafers) is used.

A helium (He) atmosphere or another noble gas atmosphere is employed as the atmosphere of the UV curing treatment.

The gas flow rate of helium (He) is in the range of 10 L/min to 20 L/min.

The substrate temperature in the UV curing treatment is in the range of 350° C. to 450° C. This temperature is set lower than the UV curing temperature for the first stress initial film 57 if the film deposition condition of the second stress initial film 58 is the same as that of the first stress initial film 57.

The atmosphere pressure of the UV curing treatment is in the range of 0.67 kPa to 1.3 kPa.

The UV lamp power is in the range of 1 kW to 10 kW.

By this UV curing treatment, the number of silicon-hydrogen bonds in the second stress initial film 58 is reduced, so that the second stress initial film 58 becomes a second stress film 56 having tensile stress and higher film density.

Because the UV curing temperature for the second stress initial film 58 is set lower than that for the first stress initial film 57, the tensile stress of the second stress film 56 is lower than that of the first stress film 55.

The second stress film 56 formed with the above-described film deposition condition is obtained as a silicon nitride film that contains hydrogen at a ratio in the range of 12 atomic % to 25 atomic % and has tensile stress in the range of 0.8 GPa to 1.6 GPa.

For example, the etching rate of the second stress film 56 can be kept lower than about 0.3 nm/min in wet etching with use of a dilute hydrofluoric acid prepared at a dilution rate of 1:100 as the etching species.

The above-described UV curing treatment allows control of the tensile stress value of the silicon nitride film dependent on the treatment temperature (substrate temperature) therein. In the above-described case, employing a treatment temperature in the range of 450° C. to 550° C. can provide a silicon nitride film having tensile stress that is higher than 1.6 GPa and at most 2.0 GPa, and employing a treatment temperature in the range of 350° C. to 450° C. can provide a silicon nitride film having tensile stress in the range of 0.8 GPa to 1.6 GPa. By adjusting the treatment temperature in this manner, the tensile stress value of the silicon nitride film can be controlled.

If the hydrogen concentration in the second stress film 56 is higher than 25 atomic %, it is impossible to achieve etch resistance against a wet etching liquid for silicon oxide, such as a dilute hydrofluoric acid. If the hydrogen concentration in the second stress film 56 is lower than 12 atomic %, the tensile stress in the film is too high with the thickness of the second stress film 56 and thus cracks will easily occur. Therefore, the hydrogen concentration in the second stress film 56 is set in the range of 12 atomic % to 25 atomic %.

If the thickness of the second stress film 56 is smaller than 30 nm, the degree of application of the tensile stress is low with the tensile stress of the second stress film 56. If the thickness of the second stress film 56 is larger than 70 nm, the degree of application of the tensile stress is too high and thus cracks will easily occur even with the tensile stress of the second stress film 56 (in the range of 0.8 GPa to 1.6 GPa). In addition, it is sufficient that the total thickness of the first stress film 55 and the second stress film 56 is about 100 nm because the height of the gate electrode is about 100 nm. In view of these circumstances, the thickness of the second stress film 56 is set in the range of 30 nm to 70 nm.

Based on the above-described conditions, the second stress film 56 (in the case of a tensile stress film) has tensile stress in the range of 0.8 GPa to 1.6 GPa.

Therefore, the first stress film 55 and the second stress film 56 are formed of films having etch resistance against the etching species used in etching of the dummy gate pattern 42 and the dummy gate insulating film 41. In addition, the first stress film 55 is formed of an insulating film that is superior to the second stress film 56 in the etch resistance against the etching species.

Figure 5F:
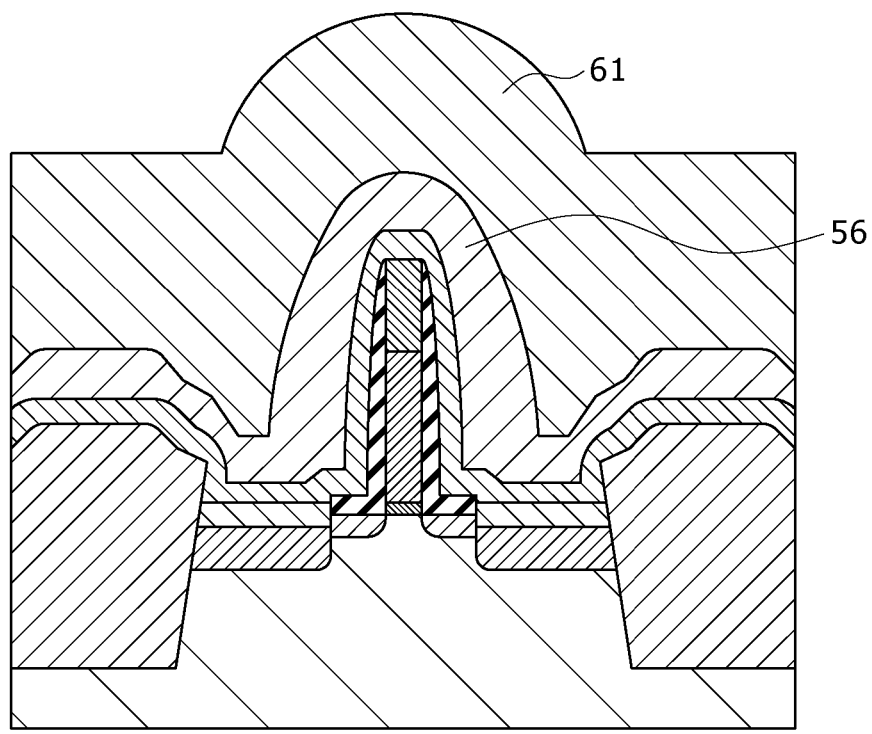

Subsequently, as shown in FIG. 5F, an insulating film 61 is formed on the second stress film 56. This insulating film 61 is referred to as e.g. a pre-metal deposition (PMD) film, and is formed of an oxide film such as a silicon oxide film or non-doped silicate glass (SA-NSG) manufactured by e.g. high-density plasma (HDP) CVD.

Figure 5G:
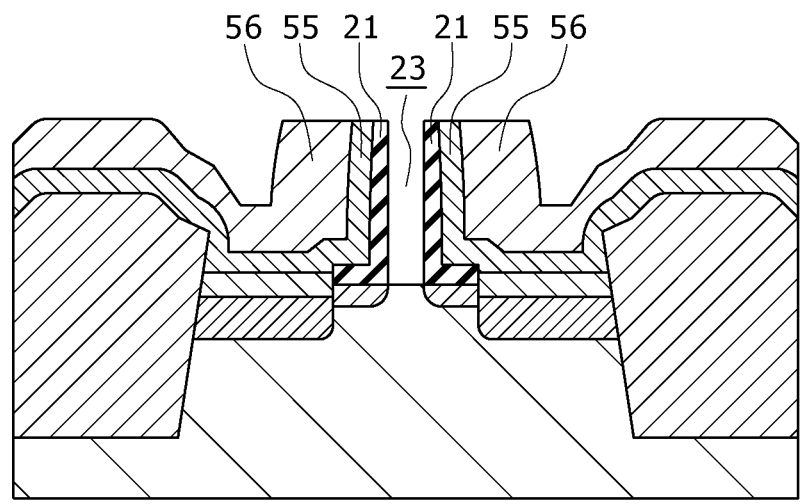

Referring next to FIG. 5G, upper part of the part composed of poly-silicon, of the dummy gate pattern 42, is exposed. Specifically, for example, the silicon nitride film 43, the first stress film 55, the second stress film 56, the insulating film 61, and so on formed above the poly-silicon of the dummy gate pattern 42 are removed by chemical mechanical polishing (CMP) to thereby expose the poly-silicon of the dummy gate pattern 42.

In the chemical mechanical polishing, the surface of the insulating film 61 is planarized first. Furthermore, upper part and so on of the silicon nitride film 43, the first stress film 55, the second stress film 56, the insulating film 61, and the sidewall insulating film 21 are polished until upper part of the part composed of poly-silicon, of the dummy gate pattern 42, is exposed.

Subsequently, the dummy gate pattern 42 (see FIG. 5A) composed of poly-silicon is removed by dry etching. Moreover, the dummy gate insulating film 41 (see FIG. 5A) is removed by wet etching. In this wet etching, e.g. a dilute hydrofluoric acid (DHF) is used. In this case, the insulating film 61 (see FIG. 5F) composed of silicon oxide is also removed.

As a result, a gate electrode formation trench 23 is formed inside the sidewall insulating film 21.

In this wet etching, the stress film on the sidewall of the sidewall insulating film 21 is not etched differently from the related art because both the first stress film 55 and the second stress film 56 are formed of the silicon nitride film having wet-etching resistance and the first stress film 55 is superior to the second stress film 56 in the wet-etching resistance. Therefore, the film thickness loss of the first stress film 55 in the wet etching step of removing silicon oxide can be suppressed, which makes it possible to effectively apply stress to the channel region formed in the semiconductor substrate below the gate electrode formation trench 23.

Figure 5H:
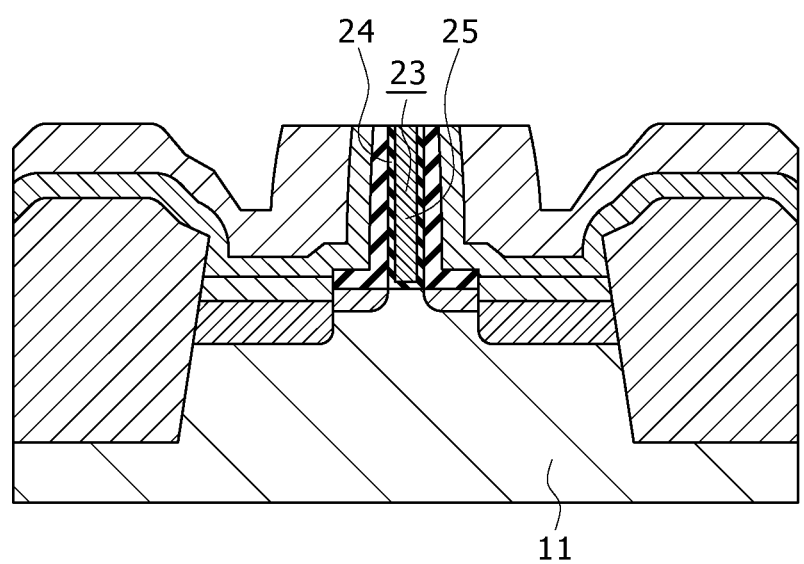

Subsequently, as shown in FIG. 5H, above the semiconductor substrate 11 inside the gate electrode formation trench 23, a gate electrode 25 is formed with the intermediary of a gate insulating film 24.

The gate insulating film 24 is formed by using a high-k film having a dielectric constant higher than that of e.g. silicon oxide. For example, it is formed by using a metal oxide, a metal oxide silicate, a metal oxynitride, or a nitrided metal oxide silicate of one kind of metal selected from hafnium (Hf), lanthanum (La), aluminum (Al), zirconium (Zn), and tantalum (Ta). As one example of the specific material, any of the following substances can be used: metal oxides such as hafnium oxide ($HfO_2$), aluminum oxide ($Al_2O_3$), and lanthanum oxide ($La_2O_3$); metal oxynitrides such as hafnium oxynitride (HfON) and aluminum oxynitride (AlON); metal oxide silicates such as hafnium silicate (HfSiO); and nitrided metal oxide silicates such as nitrided hafnium silicate (HfSiON).

Furthermore, as one example, the gate insulating film 24 may be a component obtained by stacking the above-described high-k insulating film on a silicon-based insulating film such as a silicon oxide film or a silicon nitride film.

For the gate electrode 25, any of e.g. the following materials is used: metals such as titanium (Ti), ruthenium (Ru), hafnium (Hf), iridium (Ir), tungsten (W), molybdenum (Mo), lanthanum (La), and nickel (Ni); silicon compounds of these metals; and metal compounds such as nitrogen compounds having electrical conductivity. In addition, poly-silicon can also be used.

Between the gate insulating film 24 and the gate electrode 25, a close-coupled layer (not shown) composed of titanium nitride, titanium, or the like may be formed.

In the manufacturing method of the fourth embodiment example, the first stress film 55 is formed over the sidewall of the gate electrode 25 with the intermediary of the sidewall insulating film 21, and the second stress film 56 having the same type of stress as that of this first stress film 55 is formed. This makes it possible to apply the stress of the first stress film 55 and the second stress film 56 to the channel region formed in the semiconductor substrate 11 below the gate electrode 25.

For example, if this semiconductor device 2 is an NMOS transistor, the mobility of the NMOS transistor can be enhanced if the stress of the first stress film 55 and the second stress film 56 is tensile stress.

Furthermore, the first stress film 55 and the second stress film 56 have etch resistance against the etching species used in etching of a silicon oxide film, such as a dilute hydrofluoric acid, and the first stress film 55 is formed by using an insulating film that is superior to the second stress film 56 in the etch resistance against the etching species. Therefore, in etching of a silicon oxide film in the formation of the gate electrode formation trench 23, the first stress film 55 and the second stress film 56 are poorly etched by the etching species of this etching. In addition, even if the first stress film 55 and the second stress film 56 are etched, the degree of the etching of the first stress film 55 is lower than that of the second stress film 56 because the first stress film 55 is superior to the second stress film 56 in the etch resistance against the etching species.

Therefore, the first stress film 55 is left close to the sidewall of the gate electrode 25. This makes it possible to surely apply the stress of the first stress film 55 to the channel region formed in the semiconductor substrate 11 below the gate electrode 25.

Thus, because the film thickness loss of the first stress film 55 can be suppressed, the stress of the first stress film 55 can be effectively applied to the channel region of the transistor, which provides an advantage that the mobility of the transistor can be surely enhanced.

In the manufacturing method of the fourth embodiment example, e.g. disilane ($Si_2H_6$) or trisilane ($Si_3H_8$) may be used instead of monosilane as the source gas for the film deposition of the first stress initial film 57 and the second stress initial film 58. Also when disilane ($Si_2H_6$) or trisilane ($Si_3H_8$) is used instead of monosilane, the same advantage as that of the above-described manufacturing method can be achieved.

A method for manufacturing a semiconductor device according to one embodiment (fifth embodiment example) of the present invention will be described below with reference to sectional views of FIGS. 6A to 6I showing manufacturing steps.

Figure 6A:
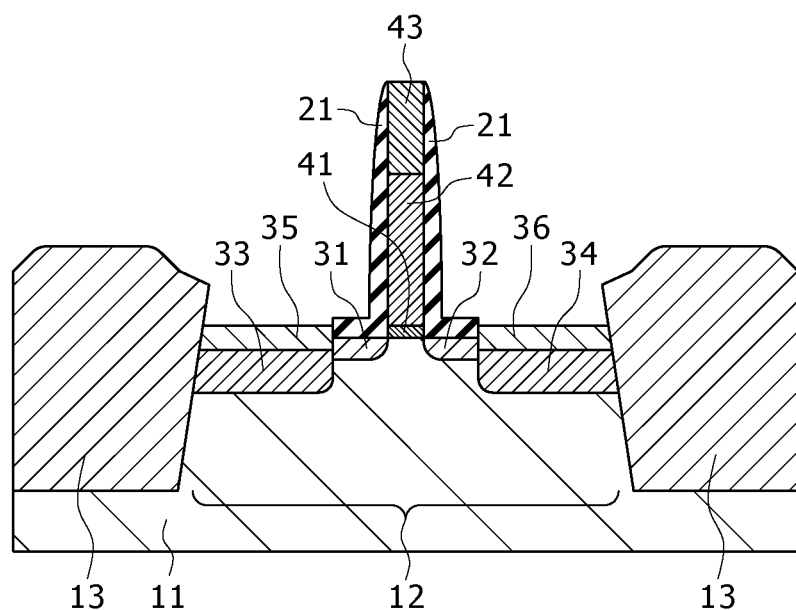
FIGS. 6A, 6B, 6C, 6D, 6E, 6F, 6G, 6H and 6I are sectional views showing manufacturing steps in a method for manufacturing a semiconductor device according to one embodiment (fifth embodiment example) of the present invention.

As shown in FIG. 6A, element isolation regions 13 by which an element formation region 12 is isolated are formed on a semiconductor substrate 11, and then a dummy gate pattern 42 is formed above the element formation region 12 of the semiconductor substrate 11 with the intermediary of a dummy gate insulating film 41. The dummy gate pattern 42 is formed of a poly-silicon film, and a silicon nitride film 43 may be formed thereon as shown in the drawing. The dummy gate insulating film 41 is formed of a silicon oxide film.

Lightly doped regions 31 and 32 are formed in the semiconductor substrate 11 on both the sides of the dummy gate pattern 42. The lightly doped regions 31 and 32 are referred to also as extension regions. A sidewall insulating film 21 is formed on the sidewall of the dummy gate pattern 42 above the lightly doped regions 31 and 32. This sidewall insulating film 21 is formed of a silicon nitride film.

Furthermore, in the semiconductor substrate 11 on both the sides of the dummy gate pattern 42, heavily doped regions 33 and 34 having impurity concentration higher than that of the lightly doped regions 31 and 32 are formed with the intermediary of the lightly doped regions 31 and 32. The lightly doped regions 31 and 32 and the heavily doped regions 33 and 34 serve as the source and drain regions.

Metal silicide layers 35 and 36 are formed on the heavily doped regions 33 and 34. The metal silicide layers 35 and 36 are composed of e.g. cobalt silicide, nickel silicide, or nickel-platinum silicide.

Figure 6B:
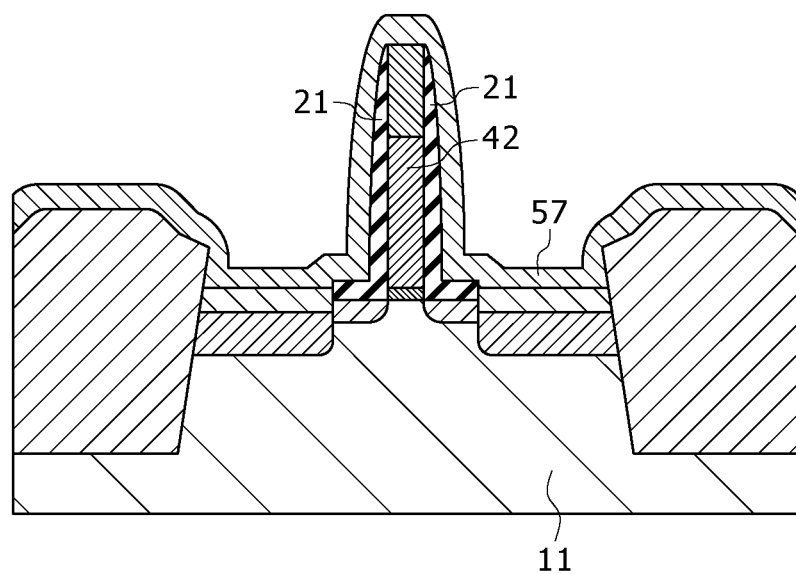

Subsequently, as shown in FIG. 6B, a first stress film to apply stress to the channel region of the transistor is formed over the semiconductor substrate 11 in such a manner as to cover the dummy gate pattern 42, the sidewall insulating film 21, and so on. In general, this first stress film is formed by using e.g. a silicon nitride film having tensile stress for an NMOS transistor, and is formed by using e.g. a silicon nitride film having compressive stress for a PMOS transistor. The following description will deal with the first stress film having tensile stress.

The thickness of the first stress film formed of the silicon nitride film having tensile stress is set at least 5 nm and smaller than 30 nm for example.

For example, a silicon nitride film having high tensile stress that is higher than 1.6 GPa and at most 2.0 GPa is formed by film deposition with one example of the deposition condition, described below.

The silicon nitride film with such high tensile stress has high film density, and thus serves as a film having etch resistance against the etching species used in etching of silicon oxide.

The first stress film is formed through the following steps.

Initially, a first stress initial film 57 to apply stress to the channel region of the transistor is formed over the semiconductor substrate 11 in such a manner as to cover the dummy gate pattern 42, the sidewall insulating film 21, and so on.

One example of the film deposition condition of the first stress initial film 57 is as follows.

As the source gas, nitrogen ($N_2$), ammonia ($NH_3$), and monosilane ($SiH_4$) are used.

The gas flow rate of nitrogen ($N_2$) is in the range of 500 $cm^3$/min to 2000 $cm^3$/min.

The gas flow rate of ammonia ($NH_3$) is in the range of 500 $cm^3$/min to 1500 $cm^3$/min.

The gas flow rate of monosilane ($SiH_4$) is in the range of 50 $cm^3$/min to 300 $cm^3$/min.

The substrate temperature in the film deposition is in the range of 250° C. to 350° C.

The pressure of the film deposition atmosphere is in the range of 667 Pa to 2.0 kPa.

The RF power (high frequency) is in the range of 50 W to 150 W.

The RF power (low frequency) is 0 W.

Figure 6C:
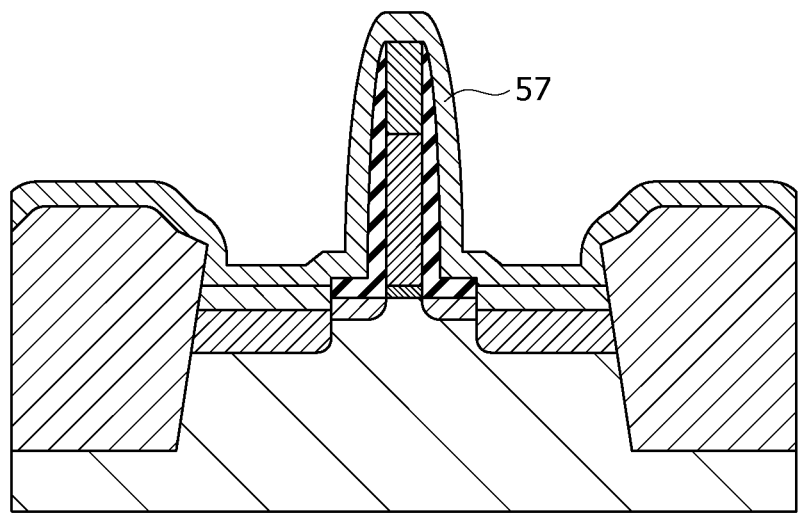

Subsequently, as shown in FIG. 6C, UV curing treatment is performed for the first stress initial film 57. One example of the condition of this UV curing treatment is as follows.

Single-wafer UV curing treatment apparatus (for 200 mm wafers) is used.

A helium (He) atmosphere or another noble gas atmosphere is employed as the atmosphere of the UV curing treatment.

The gas flow rate of helium (He) is in the range of 10 L/min to 20 L/min.

The substrate temperature in the UV curing treatment is in the range of 350° C. to 450° C.

The atmosphere pressure of the UV curing treatment is in the range of 0.67 kPa to 1.3 kPa.

The UV lamp power is in the range of 1 kW to 10 kW.

By this UV curing treatment, the number of silicon-hydrogen bonds in the first stress initial film 57 is reduced, which allows the first stress initial film 57 to have tensile stress.

Figure 6D:
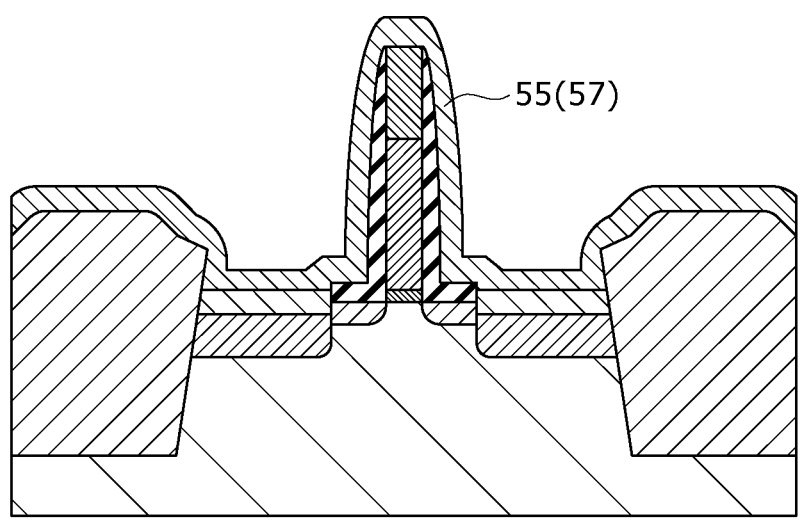

Subsequently, as shown in FIG. 6D, heat treatment is performed for the first stress initial film 57. One example of the heat treatment condition is as follows. A nitrogen ($N_2$) gas atmosphere is employed as the heat treatment atmosphere.

The gas flow rate of nitrogen ($N_2$) is in the range of 5000 $cm^3$/min to 20000 $cm^3$/min.

The substrate temperature in the heat treatment is in the range of 450° C. to 550° C.

By this heat treatment, the hydrogen amount in the film is decreased, and the film density thereof increases due to coupling of nitrogen in the heat treatment atmosphere with dangling bonds of silicon. Consequently, the tensile stress of the first stress initial film 57 is increased, so that the first stress initial film 57 becomes a first stress film 55 having a tensile stress value that is larger than 1.6 GPa and at most 2.0 GPa.

A noble gas may be used in the heat treatment if only the decrease in the hydrogen amount in the film is intended.

The etching rate of the first stress film 55 can be kept lower than about 0.2 nm/min in wet etching with use of a dilute hydrofluoric acid prepared at a dilution rate of 1:100 as the etching species.

If the thickness of the first stress film 55 is smaller than 5 nm, the degree of application of the tensile stress is low and the etching rate of the first stress film 55 is high. If the thickness of the first stress film 55 is 30 nm or larger, the degree of application of the tensile stress is too high and thus cracks will easily occur in the film because the first stress film 55 has high tensile stress (higher than 1.6 GPa and at most 2.0 GPa). Therefore, the thickness of the first stress film 55 is set at least 5 nm and smaller than 30 nm.

Figure 6E:
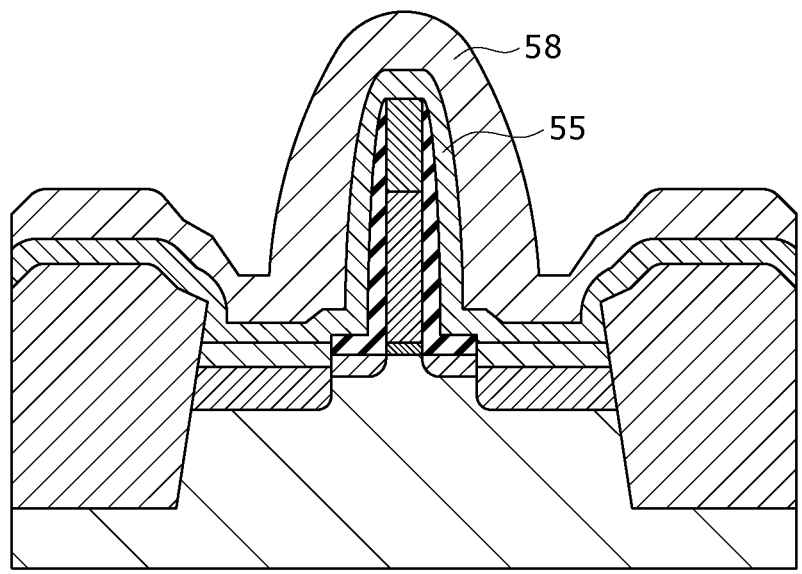

Subsequently, as shown in FIG. 6E, a second stress film having tensile stress is formed on the first stress film 55. In the case of an NMOS transistor, this second stress film is generally formed of e.g. a silicon nitride film having tensile stress. The following description will deal with the second stress film having tensile stress.

The thickness of the second stress film formed of the silicon nitride film having tensile stress is set in the range of 30 nm to 70 nm for example.

For example, a silicon nitride film having tensile stress in the range of 0.8 GPa to 1.6 GPa can be formed by film deposition with one example of the deposition condition, described below.

The silicon nitride film with such tensile stress has high film density, and thus serves as a film having etch resistance against the etching species used in etching of silicon oxide. The first stress film 55 is an insulating film that is superior to this second stress film in the etch resistance against the etching species for etching of silicon oxide.

The second stress film is formed through the following steps.

Initially, a second stress initial film 58 to apply stress to the channel region of the transistor is formed on the first stress film 55.

One example of the film deposition condition of the second stress initial film 58 is as follows.

As the source gas, nitrogen ($N_2$), ammonia ($NH_3$), and monosilane ($SiH_4$) are used.

The gas flow rate of nitrogen ($N_2$) is in the range of 500 cm$^3$/min to 2000 cm$^3$/min.

The gas flow rate of ammonia ($NH_3$) is in the range of 500 cm$^3$/min to 1500 cm$^3$/min.

The gas flow rate of monosilane ($SiH_4$) is in the range of 50 cm$^3$/min to 300 cm$^3$/min.

The substrate temperature in the film deposition is in the range of 250° C. to 350° C.

The pressure of the film deposition atmosphere is in the range of 667 Pa to 2.0 kPa.

The RF power (high frequency) is in the range of 50 W to 150 W.

The RF power (low frequency) is 0 W.

Figure 6F:
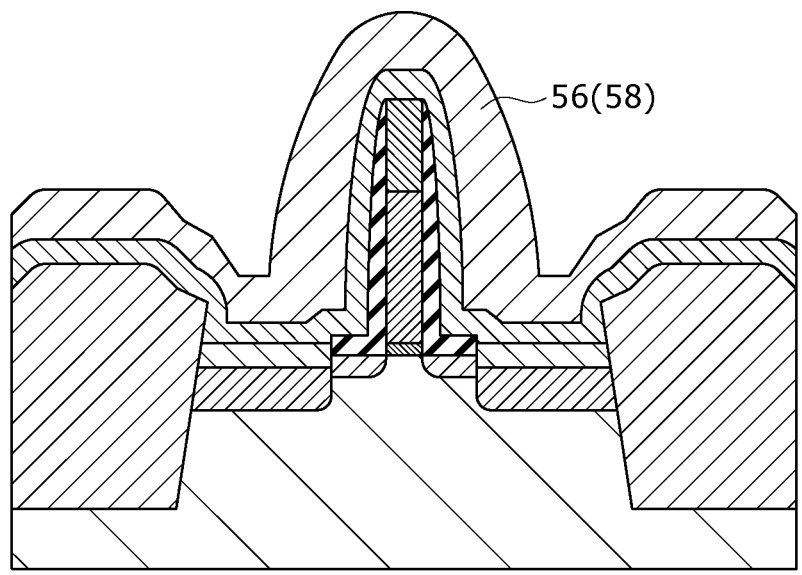

Subsequently, as shown in FIG. 6F, UV curing treatment is performed for the second stress initial film 58. One example of the condition of this UV curing treatment is as follows.

Single-wafer UV curing treatment apparatus (for 200 mm wafers) is used.

A helium (He) atmosphere or another noble gas atmosphere is employed as the atmosphere of the UV curing treatment.

The gas flow rate of helium (He) is in the range of 10 L/min to 20 L/min.

The substrate temperature in the UV curing treatment is in the range of 350° C. to 450° C. This temperature is set lower than the UV curing temperature for the first stress initial film 57 if the film deposition condition of the second stress initial film 58 is the same as that of the first stress initial film 57.

The atmosphere pressure of the UV curing treatment is in the range of 0.67 kPa to 1.3 kPa.

The UV lamp power is in the range of 1 kW to 10 kW.

By this UV curing treatment, the number of silicon-hydrogen bonds in the second stress initial film 58 is reduced, which allows the second stress initial film 58 to have tensile stress and become a second stress film 56 having higher film density.

Because the UV curing temperature for the second stress initial film 58 is set lower than that for the first stress initial film 57, the tensile stress of the second stress film 56 is lower than that of the first stress film 55.

The second stress film 56 formed with the above-described film deposition condition is obtained as a silicon nitride film that contains hydrogen at a ratio in the range of 12 atomic % to 25 atomic % and has tensile stress in the range of 0.8 GPa to 1.6 GPa.

For example, the etching rate of the second stress film 56 can be kept lower than about 0.3 nm/min in wet etching with use of a dilute hydrofluoric acid prepared at a dilution rate of 1:100 as the etching species.

If the hydrogen concentration in the second stress film 56 is higher than 25 atomic %, it is impossible to achieve etch resistance against a wet etching liquid for silicon oxide, such as a dilute hydrofluoric acid. If the hydrogen concentration in the second stress film 56 is lower than 12 atomic %, the tensile stress in the film is too high with the thickness of the second stress film 56 and thus cracks will easily occur. Therefore, the hydrogen concentration in the second stress film 56 is set in the range of 12 atomic % to 25 atomic %.

If the thickness of the second stress film 56 is smaller than 30 nm, the degree of application of the tensile stress is low with the tensile stress of the second stress film 56. If the thickness of the second stress film 56 is larger than 70 nm, the degree of application of the tensile stress is too high and thus cracks will easily occur even with the tensile stress of the second stress film 56 (in the range of 0.8 GPa to 1.6 GPa). In addition, it is sufficient that the total thickness of the first stress film 55 and the second stress film 56 is about 100 nm because the height of the gate electrode is about 100 nm. In view of these circumstances, the thickness of the second stress film 56 is set in the range of 30 nm to 70 nm.

Based on the above-described conditions, the second stress film 56 (in the case of a tensile stress film) has tensile stress in the range of 0.8 GPa to 1.6 GPa.

Therefore, the first stress film 55 and the second stress film 56 are formed of films having etch resistance against the etching species used in etching of the dummy gate pattern 42 and the dummy gate insulating film 41. In addition, the first stress film 55 is formed of an insulating film that is superior to the second stress film 56 in the etch resistance against the etching species.

Figure 6G:
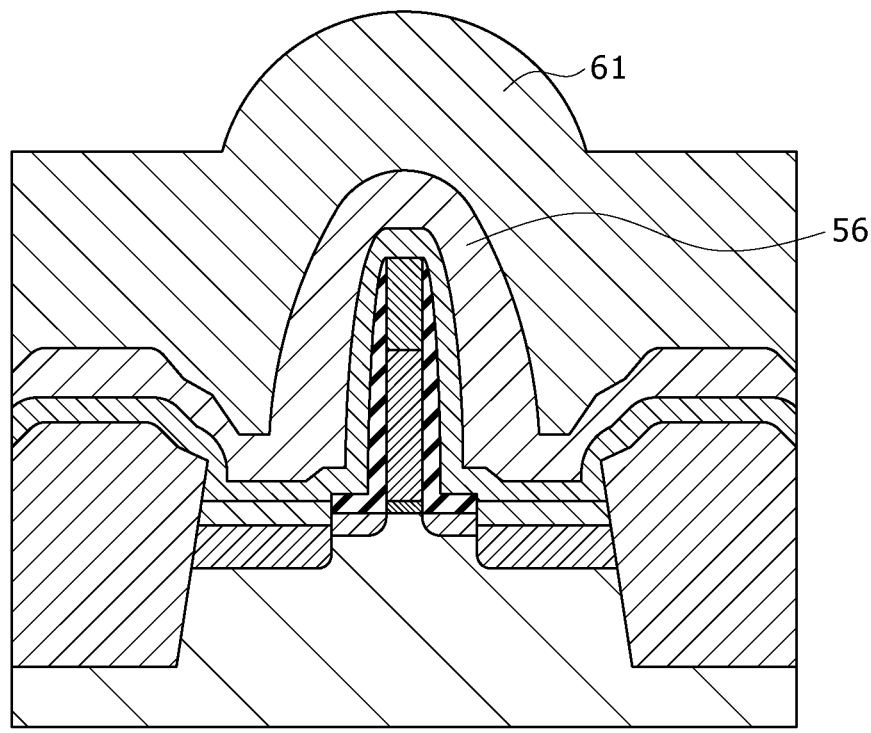

Subsequently, as shown in FIG. 6G, an insulating film 61 is formed on the second stress film 56. This insulating film 61 is referred to as e.g. a pre-metal deposition (PMD) film, and is formed of an oxide film such as a silicon oxide film or non-doped silicate glass (SA-NSG) manufactured by e.g. high-density plasma (HDP) CVD.

Figure 6H:
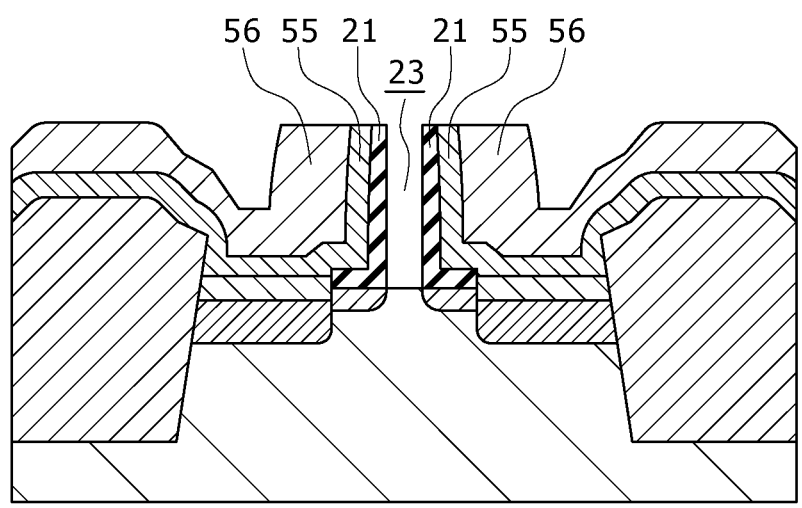

Referring next to FIG. 6H, upper part of the part composed of poly-silicon, of the dummy gate pattern 42, is exposed. Specifically, for example, the silicon nitride film 43, the first stress film 55, the second stress film 56, the insulating film 61, and so on formed above the poly-silicon of the dummy gate pattern 42 are removed by chemical mechanical polishing (CMP) to thereby expose the poly-silicon of the dummy gate pattern 42.

In the chemical mechanical polishing, the surface of the insulating film 61 is planarized first. Furthermore, upper part and so on of the silicon nitride film 43, the first stress film 55, the second stress film 56, the insulating film 61, and the sidewall insulating film 21 are polished until upper part of the part composed of poly-silicon, of the dummy gate pattern 42, is polished.

Subsequently, the dummy gate pattern 42 (see FIG. 6A) composed of poly-silicon is removed by dry etching. Moreover, the dummy gate insulating film 41 (see FIG. 6A) is removed by wet etching. In this wet etching, e.g. a dilute hydrofluoric acid (DHF) is used. In this case, the insulating film 61 (see FIG. 6G) composed of silicon oxide is also removed.

As a result, a gate electrode formation trench 23 is formed inside the sidewall insulating film 21.

In this wet etching, the stress film on the sidewall of the sidewall insulating film 21 is not etched differently from the related art because both the first stress film 55 and the second stress film 56 are formed of the silicon nitride film having wet-etching resistance and the first stress film 55 is superior to the second stress film 56 in the wet-etching resistance. Therefore, the film thickness loss of the first stress film 55 in the wet etching step of removing silicon oxide can be suppressed, which makes it possible to effectively apply stress to the channel region formed in the semiconductor substrate below the gate electrode formation trench 23.

Figure 6I:
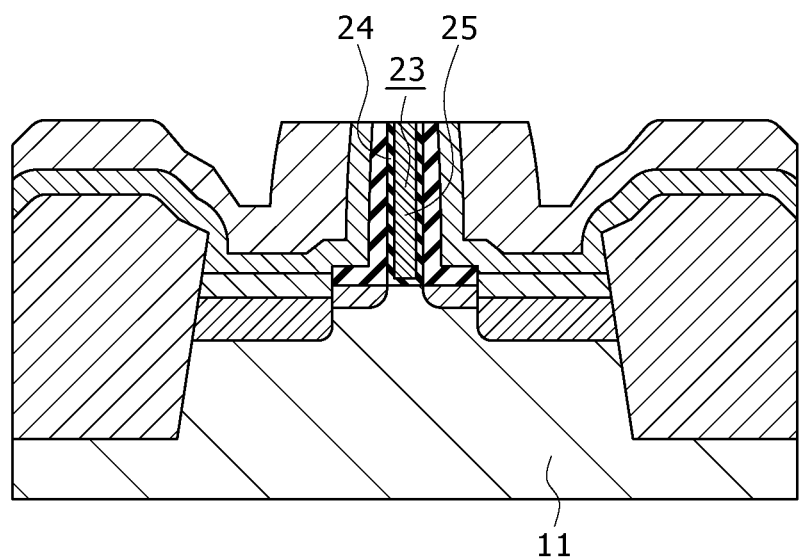
Figure 7A:
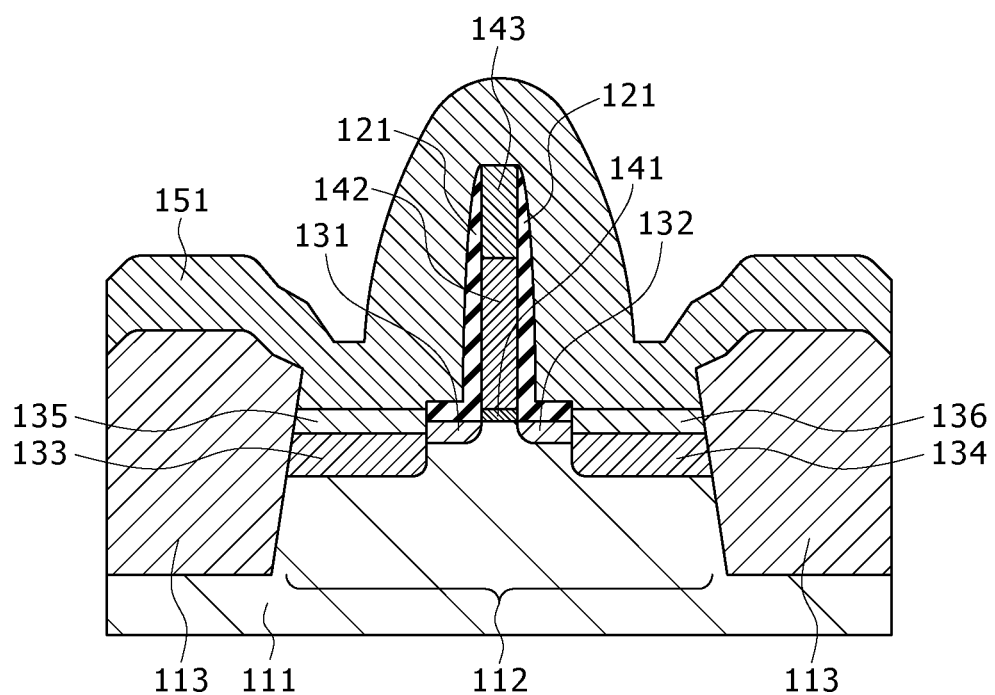
FIGS. 7A and 7B are sectional views showing manufacturing steps in one example of a manufacturing method of a related art.
Figure 7B:
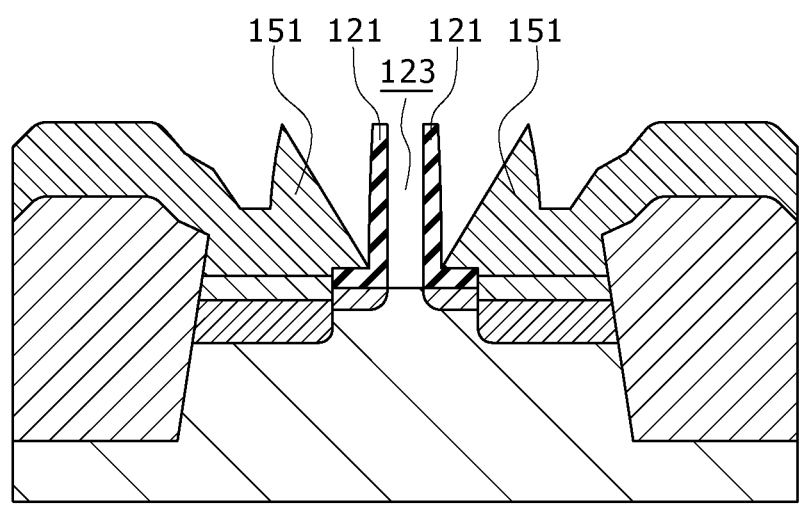
Figure 8:
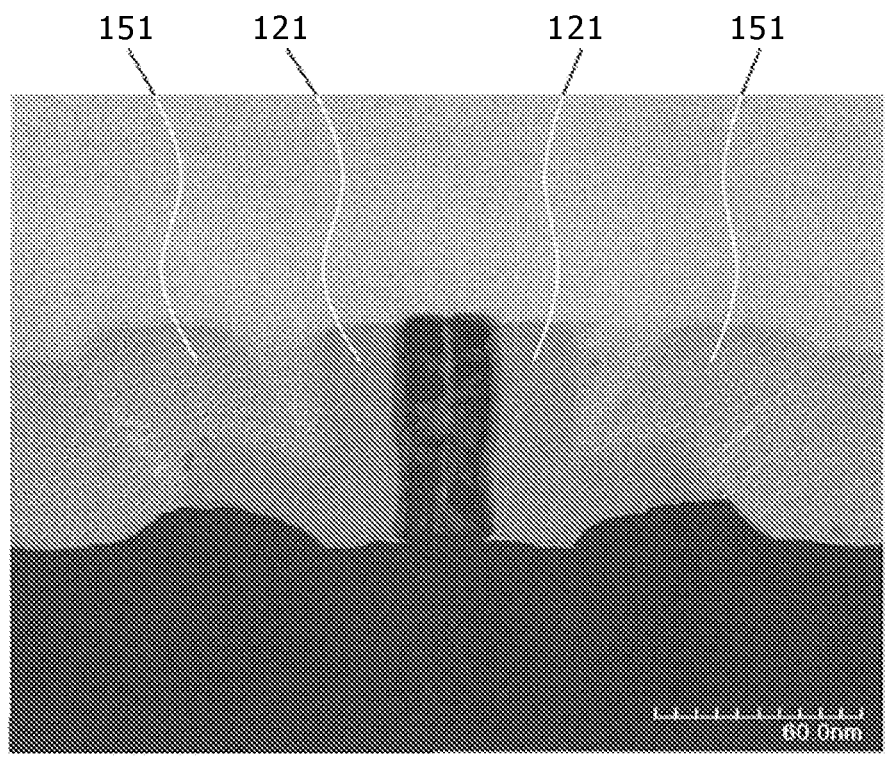
FIG. 8 is an electron micrograph image showing a problem.

Subsequently, as shown in FIG. 6I, above the semiconductor substrate 11 inside the gate electrode formation trench 23, a gate electrode 25 is formed with the intermediary of a gate insulating film 24.

The gate insulating film 24 is formed by using a high-k film having a dielectric constant higher than that of e.g. silicon oxide. For example, it is formed by using a metal oxide, a metal oxide silicate, a metal oxynitride, or a nitrided metal oxide silicate of one kind of metal selected from hafnium (Hf), lanthanum (La), aluminum (Al), zirconium (Zn), and tantalum (Ta). As one example of the specific material, any of the following substances can be used: metal oxides such as hafnium oxide ($HfO_2$), aluminum oxide ($Al_2O_3$), and lanthanum oxide ($La_2O_3$); metal oxynitrides such as hafnium oxynitride (HfON) and aluminum oxynitride (AlON); metal oxide silicates such as hafnium silicate (HfSiO); and nitrided metal oxide silicates such as nitrided hafnium silicate (HfSiON).

Furthermore, as one example, the gate insulating film 24 may be a component obtained by stacking the above-described high-k insulating film on a silicon-based insulating film such as a silicon oxide film or a silicon nitride film.

For the gate electrode 25, any of e.g. the following materials is used: metals such as titanium (Ti), ruthenium (Ru), hafnium (Hf), iridium (Ir), tungsten (W), molybdenum (Mo), lanthanum (La), and nickel (Ni); silicon compounds of these metals; and metal compounds such as nitrogen compounds having electrical conductivity. In addition, polysilicon can also be used.

Between the gate insulating film 24 and the gate electrode 25, a close-coupled layer (not shown) composed of titanium nitride, titanium, or the like may be formed.

In the manufacturing method of the fifth embodiment example, the first stress film 55 is formed over the sidewall of the gate electrode 25 with the intermediary of the sidewall insulating film 21, and the second stress film 56 having the same type of stress as that of this first stress film 55 is formed. This makes it possible to apply the stress of the first stress film 55 and the second stress film 56 to the channel region formed in the semiconductor substrate 11 below the gate electrode 25.

For example, if this semiconductor device 2 is an NMOS transistor, the mobility of the NMOS transistor can be enhanced if the stress of the first stress film 55 and the second stress film 56 is tensile stress.

Furthermore, the first stress film 55 and the second stress film 56 have etch resistance against the etching species used in etching of a silicon oxide film, such as a dilute hydrofluoric acid, and the first stress film 55 is formed by using an insulating film that is superior to the second stress film 56 in the etch resistance against the etching species. Therefore, in etching of a silicon oxide film in the formation of the gate electrode formation trench 23, the first stress film 55 and the second stress film 56 are poorly etched by the etching species of this etching. In addition, even if the first stress film 55 and the second stress film 56 are etched, the degree of the etching of the first stress film 55 is lower than that of the second stress film 56 because the first stress film 55 is superior to the second stress film 56 in the etch resistance against the etching species.

Therefore, the first stress film 55 is left close to the sidewall of the gate electrode 25. This makes it possible to surely apply the stress of the first stress film 55 to the channel region formed in the semiconductor substrate 11 below the gate electrode 25.

Thus, because the film thickness loss of the first stress film 55 can be suppressed, the stress of the first stress film 55 can be effectively applied to the channel region of the transistor, which provides an advantage that the mobility of the transistor can be surely enhanced.

In the manufacturing method of the fifth embodiment example, e.g. disilane ($Si_2H_6$) or trisilane ($Si_3H_8$) may be used instead of monosilane as the source gas for the film deposition of the first stress initial film 57 and the second stress initial film 58. Also when disilane ($Si_2H_6$) or trisilane ($Si_3H_8$) is used instead of monosilane, the same advantage as that of the above-described manufacturing method can be achieved.

A method for manufacturing a semiconductor device according to one embodiment (sixth embodiment example) of the present invention will be described below.

The manufacturing method of the sixth embodiment example is equivalent to a method in which heat treatment is performed after the formation of the first stress film 55 in the manufacturing method of the fourth embodiment example. Except for this heat treatment, the manufacturing method of the sixth embodiment example is the same as that of the fourth embodiment example.

One example of the heat treatment condition in the sixth embodiment example is as follows. A nitrogen ($N_2$) gas atmosphere is employed as the heat treatment atmosphere.

The gas flow rate of nitrogen ($N_2$) is in the range of 5000 $cm^3$/min to 20000 $cm^3$/min.

The substrate temperature in the heat treatment is in the range of 450° C. to 550° C.

By this heat treatment, the hydrogen amount in the first stress film 55 is decreased and thus the film density thereof increases. Consequently, the tensile stress is increased, so that the first stress film 55 becomes a film having a larger tensile stress value.

A noble gas may be used in this heat treatment.

This heat treatment should be so performed that the tensile stress value of the first stress film 55 will not become too large. If the tensile stress of the first stress film 55 surpasses 2.0 GPa, cracks possibly occur in the film as described above. Therefore, the heat treatment is so performed that the tensile stress value of the first stress film 55 will be at most 2.0 GPa.

Due to this heat treatment, the etching rate of the first stress film 55 can be kept lower than about 0.2 nm/min in wet etching with use of a dilute hydrofluoric acid prepared at a dilution rate of 1:100 as the etching species.

The manufacturing method of the sixth embodiment example can also achieve the same advantage as that of the manufacturing method of the fourth embodiment example.

In the manufacturing methods of the respective embodiment examples, the first stress film 51 and the second stress film 52 are deposited by using general chemical vapor deposition (CVD) apparatus. The type of the apparatus may be any. For example, the apparatus may be either single-wafer type apparatus or batch type apparatus, and may be either plasma CVD apparatus or thermal CVD apparatus. For example, parallel-plate plasma CVD apparatus is used.

In the above-described heat treatment, known heat treatment apparatus can be used. It is also possible to perform this heat treatment by using substrate heating equipment in the above-described CVD apparatus. In this case, there is an advantage that the film deposition and the heat treatment can be continuously performed in situ.

For the above-described UV curing irradiation, known UV curing apparatus can be used.

In the above description, a silicon substrate is employed as the semiconductor substrate 11. However, the embodiment of the present invention can be applied also to the case in which the semiconductor device according to the embodiment of the present invention is formed on a silicon layer of a silicon-on-insulator (SOI) substrate. In this case, the silicon layer of the SOI substrate is equivalent to the semiconductor substrate.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a sidewall insulating film on a semiconductor substrate;
   a gate electrode formation trench inside the sidewall insulating film;
   a gate electrode above the semiconductor substrate and inside of the gate electrode formation trench;
   source and drain regions in the semiconductor substrate and outside of the gate electrode;
   a first stress film above the semiconductor substrate, the first stress film having a stress type; and
   a second stress film above the semiconductor substrate and outside of the first stress film, the first and second stress films having the same stress type,
   wherein,
      each of the first stress film and the second stress film has etch resistance,
      the first stress film has a greater etch resistance against an etching species than does the second stress film, and
      the first stress film and the second stress film are of a same material.

2. The semiconductor device according to claim 1, wherein:
   the first stress film and the second stress film are each formed of a silicon nitride film, and
   a film density of the first stress film is higher than a film density of the second stress film.

3. The semiconductor device according to claim 1, wherein
   the first stress film and the second stress film are each formed of a silicon nitride film that has compressive stress and contain carbon,
   the first stress film contains carbon in a ratio in a range of 6 atomic % to 8 atomic %, and
   the second stress film contains carbon in a ratio that is at least 1 atomic % and lower than 6 atomic %.

4. The semiconductor device according to claim 1, wherein
   the first stress film and the second stress film are each formed of a silicon nitride film that has tensile stress and contain hydrogen,
   the first stress film contains hydrogen in a ratio lower than 12 atomic %, and
   the second stress film contains hydrogen in a ratio in a range of 12 atomic % to 25 atomic %.

5. The semiconductor device according to claim 1, wherein the first stress film has a thickness within the range of 5 nm to 30 nm, both inclusive.

6. The semiconductor device according to claim 1, wherein the first stress film is in contact with the source and drain regions in the semiconductor substrate on both sides of the gate electrode.

7. The semiconductor device according to claim 1, wherein, the second stress film is not in direct contact with the source and drain regions in the semiconductor substrate on both sides of the gate electrode.

8. The semiconductor device according to claim 1, further comprising a silicide region on each source and drain region, wherein the first stress film is on the silicide region.

9. The semiconductor device according to claim 1, wherein the first stress film is in-between the second stress film and the substrate.

* * * * *